(12) United States Patent
Koyama

(10) Patent No.: US 7,158,104 B2
(45) Date of Patent: Jan. 2, 2007

(54) METHOD OF DRIVING DISPLAY DEVICE

(75) Inventor: Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 332 days.

(21) Appl. No.: 10/619,881

(22) Filed: Jul. 15, 2003

(65) Prior Publication Data

US 2004/0012550 A1    Jan. 22, 2004

Related U.S. Application Data

(63) Continuation of application No. 09/911,156, filed on Jul. 23, 2001, now Pat. No. 6,879,110.

(30) Foreign Application Priority Data

Jul. 27, 2000  (JP) .............................. 2000-226709

(51) Int. Cl.
G09G 3/30        (2006.01)

(52) U.S. Cl. .............................. 345/76; 345/87; 345/92

(58) Field of Classification Search ............ 345/76–92, 345/95, 204, 214; 315/169.1, 169.3
See application file for complete search history.

(56) References Cited

U.S. PATENT DOCUMENTS

| | | | |
|---|---|---|---|
| 4,356,429 A | 10/1982 | Tang ........................ | 313/503 |
| 4,539,507 A | 9/1985 | VanSlyke et al. ........... | 313/504 |
| 4,720,432 A | 1/1988 | VanSlyke et al. ........... | 428/457 |
| 4,769,292 A | 9/1988 | Tang et al. ................. | 428/690 |
| 4,885,211 A | 12/1989 | Tang et al. ................. | 428/457 |
| 4,950,950 A | 8/1990 | Perry et al. ................. | 313/504 |
| 5,047,687 A | 9/1991 | VanSlyke .................... | 313/503 |
| 5,059,861 A | 10/1991 | Littman et al. ............. | 313/503 |
| 5,059,862 A | 10/1991 | VanSlyke et al. ........... | 313/503 |
| 5,061,617 A | 10/1991 | Maskasky .................... | 430/569 |
| 5,073,446 A | 12/1991 | Scozzafava et al. ........ | 428/323 |
| 5,095,248 A | 3/1992 | Sato ........................... | 315/169.3 |
| 5,151,629 A | 9/1992 | VanSlyke .................... | 313/504 |

(Continued)

FOREIGN PATENT DOCUMENTS

EP    1 063 630 A2    12/2000

(Continued)

OTHER PUBLICATIONS

Tsutsui, T. et al, 'Electroluminescence in Organic Thin Films,' *Photochemical Processes in Organized Molecular Systems*, pp. 437-450, Elsevier Science Publishers, Tokyo, (1991).

(Continued)

*Primary Examiner*—Richard Hjerpe
*Assistant Examiner*—Mansour M. Said
(74) *Attorney, Agent, or Firm*—Cook, Alex, McFarron, Manzo, Cummings & Mehler, Ltd.

(57) ABSTRACT

An active matrix type EL display device is provided, which is capable of suppressing the unevenness of luminance display due to the unevenness of the characteristics of TFTs which constitute pixels, or due to variations in the environmental temperature at which the display device is used. The active matrix type EL display is driven by a time gray scale method, and is capable of keeping the drain current of each of its EL driving TFTs constant by operating each of the EL driving TFTs in a saturation region in an ON state. Accordingly, constant current can be made to flow in each of the EL elements, whereby it is possible to provide an active matrix type EL display device with accurate gray scale display and high image quality.

36 Claims, 18 Drawing Sheets

U.S. PATENT DOCUMENTS

| | | | |
|---|---|---|---|
| 5,247,190 A | 9/1993 | Friend et al. | 257/40 |
| 5,294,869 A | 3/1994 | Tang et al. | 313/504 |
| 5,294,870 A | 3/1994 | Tang et al. | 313/504 |
| 5,302,966 A | 4/1994 | Stewart | 345/76 |
| 5,399,502 A | 3/1995 | Friend et al. | 437/1 |
| 5,525,867 A | 6/1996 | Williams | 315/169.3 |
| 5,684,365 A | 11/1997 | Tang et al. | 315/169.3 |
| 5,714,968 A | 2/1998 | Ikeda | 345/77 |
| 5,793,342 A | 8/1998 | Rhoads | 345/76 |
| 5,839,456 A | 11/1998 | Han | 134/104.1 |
| 5,882,761 A | 3/1999 | Kawami et al. | 428/69 |
| 5,929,464 A | 7/1999 | Yamazaki et al. | 257/72 |
| 5,962,962 A | 10/1999 | Fujita et al. | 313/412 |
| 5,990,629 A * | 11/1999 | Yamada et al. | 315/169.3 |
| 6,023,259 A | 2/2000 | Howard et al. | 345/76 |
| 6,084,579 A | 7/2000 | Hirano | 345/205 |
| 6,091,203 A | 7/2000 | Kawashima et al. | 315/169.3 |
| 6,147,451 A | 11/2000 | Shibata et al. | 313/506 |
| 6,157,356 A | 12/2000 | Troutman | 345/82 |
| 6,204,610 B1 | 3/2001 | Komiya | 315/169.3 |
| 6,215,244 B1 | 4/2001 | Kuribayashi et al. | 313/505 |
| 6,268,842 B1 | 7/2001 | Yamazaki et al. | 345/98 |
| 6,281,634 B1 | 8/2001 | Yokoyama | 315/169.3 |
| 6,380,687 B1 | 4/2002 | Yamazaki | 315/169.3 |
| 6,417,825 B1 | 7/2002 | Stewart et al. | 345/76 |
| 6,440,877 B1 | 8/2002 | Yamazaki et al. | 438/780 |
| 6,452,341 B1 | 9/2002 | Yamauchi et al. | 315/169.1 |
| 6,469,405 B1 * | 10/2002 | Moya et al. | 307/130 |
| 6,704,133 B1 * | 3/2004 | Gates et al. | 359/296 |
| 2002/0153844 A1 | 10/2002 | Koyama | 315/169.3 |

FOREIGN PATENT DOCUMENTS

| | | |
|---|---|---|
| JP | 9-016122 | 1/1997 |
| JP | 10-092576 | 4/1998 |
| JP | 11-282419 | 10/1999 |
| JP | 2000-040924 | 2/2000 |
| JP | 2000-056847 | 2/2000 |
| JP | 2000-138572 | 5/2000 |
| WO | WO 90/13148 | 11/1990 |

OTHER PUBLICATIONS

Baldo, M.A. et al, 'Highly Efficient Phosphorescent Emission from Organic Electroluminescent Devices,' *Nature*, vol. 395, pp. 151-154, Sep. 10, 1998.

Dawson, R.M.A. et al, "The Impact of Transient Response of Organic Light Emitting Diodes on the Design of Active Matrix OLED Displays," IDEM 98, pp. 875-878, (1998).

Dawson, R.M.A. et al, "Design of an Improved Pixel for a Polysilicon Active-Matrix Organic LED Display," SID 98 Digest, pp. 11-14, (1998).

Dawson, R.M.A. et al, "A Poly-Si Active-Matrix OLED Display with Integrated Drivers," SID 99 Digest, pp. 438-441, (1999).

Baldo, M.A. et al, 'Very High-Efficiency Green Organic Light-Emitting Devices Based on Electrophosphorescence,' *Applied Physics Letters*, vol. 75, No. 1, pp. 4-6, Jul. 5, 1999.

Schenk, H. et al, "Polymers for Light Emitting Diodes," EURODISPLAY '99, Proceedings of the 19th International Display Research Conference, Sep. 6-9, 1999, Berlin, Germany pp. 33-37 (1999).

Tsutsui, T. et al, 'High Quantum Efficiency in Organic Light-Emitting Devices with Iridium-Complex as a Triplet Emissive Center,' *Japanese Journal of Applied Physics*, vol. 38, part 2, No. 12B, pp. L1502-L1504, Dec. 15, 1999.

Kimura, M. et al, "Low-Temperature Poly-Si TFT Display Using Light-Emitting-Polymer," AM-LCD 2000, pp. 245-248, (2000).

Hunter, I.M. et al, "Active Matrix Addressing of Polymer Light Emitting Diodes Using Low Temperature Poly Silicon TFTS," AM-LCD 2000, pp. 249-252, (2000).

Bae, S.J. et al, "A Novel Pixel Design for an Active Matrix Organic Light Emitting Diode Display," SID 2000, pp. 358-361 (2000).

U.S. Appl. No. 09/983,479 (pending) to Koyama filed Oct. 24, 2001, including specification, claims, abstract, drawings and PTO filing receipt.

U.S. Appl. No. 09/597,399 (pending) to Koyama filed Jun. 21, 2000, including specification. drawings, abstract, claims (as of Sep. 22, 2003) and PTO filing receipt.

* cited by examiner

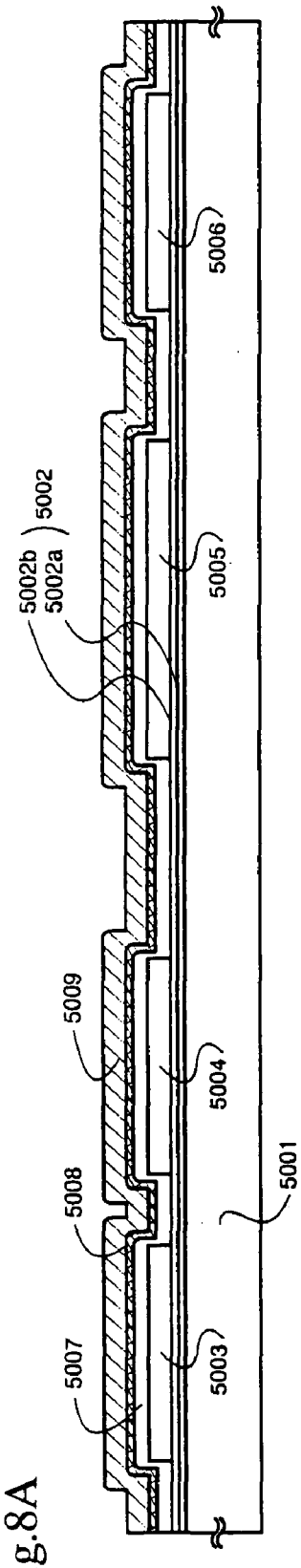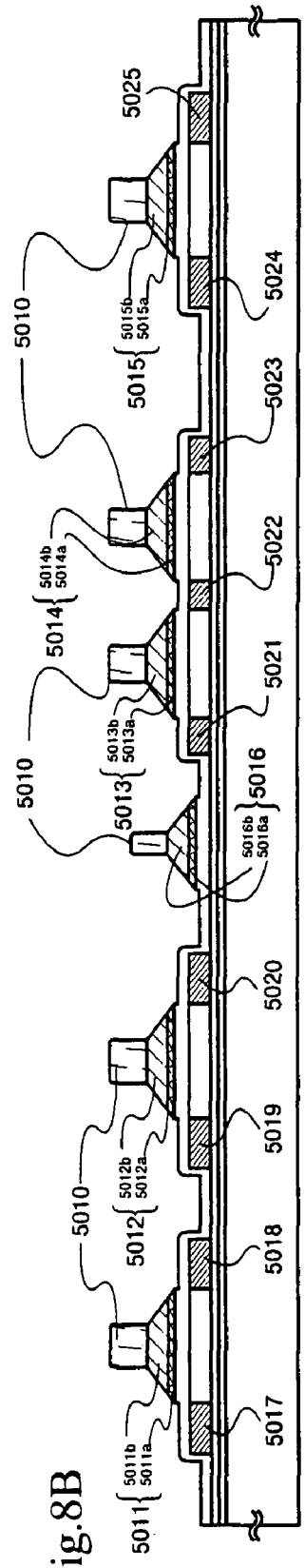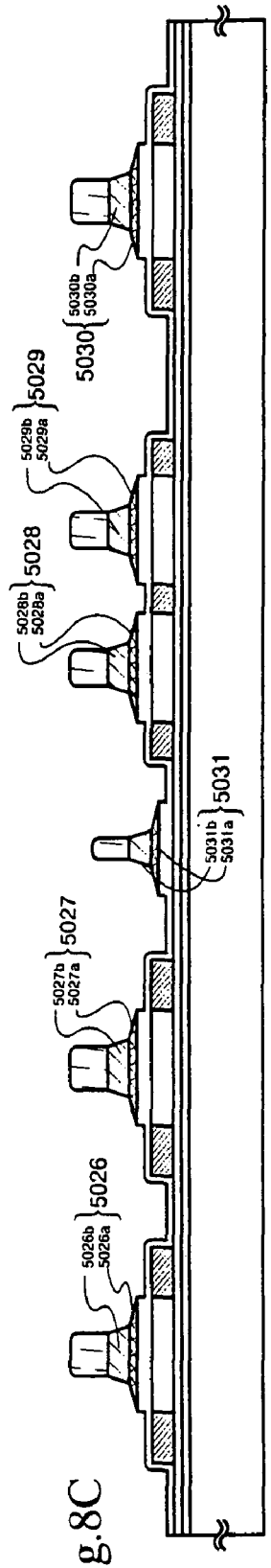

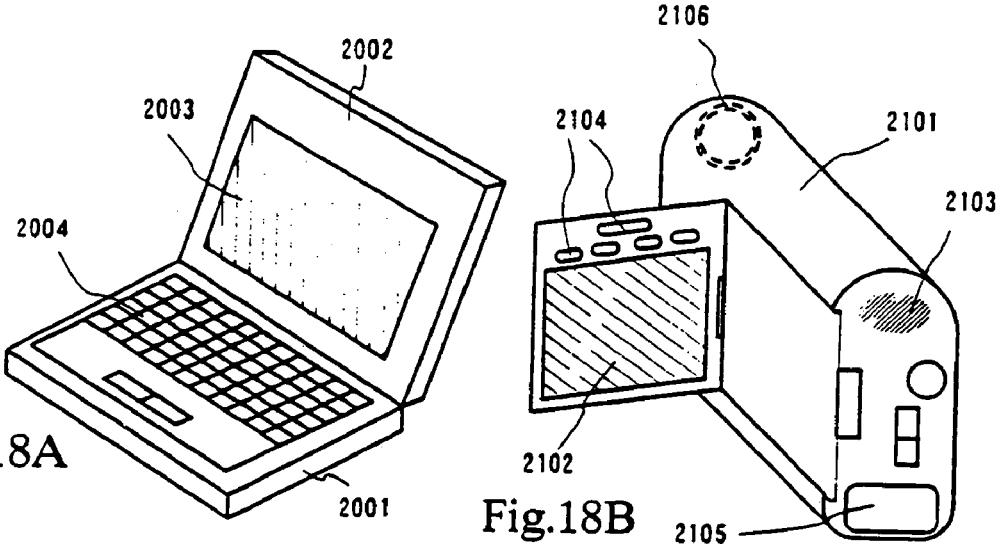
Fig.18A
Fig.18B
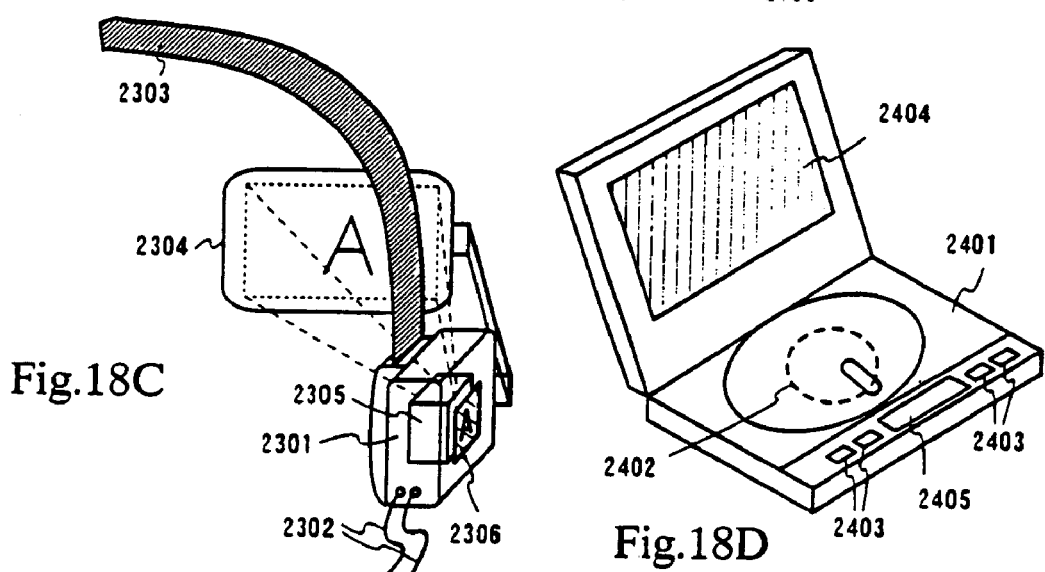
Fig.18C
Fig.18D
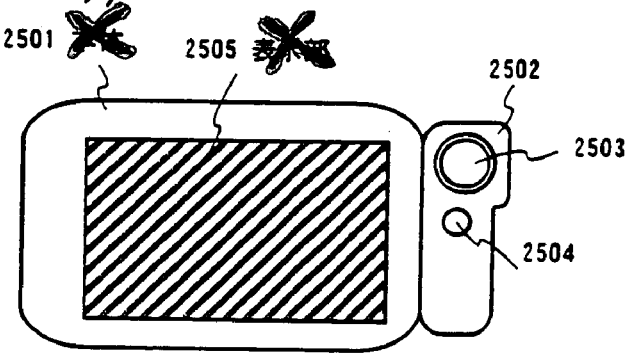
Fig.18E

METHOD OF DRIVING DISPLAY DEVICE

This application is a continuation of U.S. application Ser. No. 09/911,156, filed on Jul. 23, 2001 now U.S. Pat. No. 6,879,110.

BACKGROUND OF THE INVENTION

1. Field of the Invention

The present invention relates to a method of driving an electronic display device having EL (electro luminescence) elements formed on a substrate. More particularly, the invention relates to a method of driving an EL display device using semiconductor elements (elements using semiconductor thin films) as well as to electronic equipment of the type in which an EL display device is used as a display part.

Incidentally, the term "EL element" used herein indicates both an element which uses emission from a singlet exciter (fluorescence) and an element which uses emission from a triplet exciter (phosphorescence).

2. Description of the Related Art

In recent years, in the field of self-emitting elements, the development of EL display devices having EL elements has been becoming more and more active. EL display devices are called organic EL displays (OELD(s)) or organic light emitting diodes (OLED(s)).

Such an EL display device is of the self-emitting type which differs from liquid crystal devices. An EL element has a structure in which an EL layer is interposed between a pair of electrodes (an anode and a cathode), and ordinary EL layers have a stacked structure. Representatively, there is a stacked structure which is called "hole transport layer/light emitting layer/electron transport layer", proposed by Tang et al. of Kodak Eastman Company. This structure has very high emission efficiency, and is adopted in nearly all EL display devices currently under research and development.

Other structures may also be adopted, such as a structure in which "a hole injection layer, a hole transport layer, a light emitting layer and an electron transport layer" are stacked on an anode in that order, or a structure in which "a hole injection layer, a hole transport layer, a light emitting layer, an electron transport layer and an electron injection layer" are stacked on an anode in that order. The light emitting layer may also be doped with a fluorescent pigment or the like.

All the layers provided between a cathode and an anode are herein generically called "EL layer". Accordingly, all the aforementioned hole injection layer, hole transport layer, light emitting layer, electron transport layer and electron injection layer are encompassed in the EL layer.

When a predetermined voltage is applied across a pair of electrodes (both electrodes) of the EL layer with the above-described structure, recombination of carriers occur in the emitting layer, whereby the EL element emits light. Incidentally, "EL element emits light" is herein called "EL element is driven".

As a driving method for the EL display device, there is an active matrix type EL display device.

FIG. 3 shows an example of the construction of a pixel portion of an active matrix type EL display device. A gate signal line (Gl to Gy) to which a selection signal is to be inputted from a gate signal line driver circuit is connected to the gate electrode of a switching TFT 301 which is provided in each pixel of the pixel portion. Either one of the source and drain regions of the switching TFT 301 provided in each pixel is connected to a source signal line (Sl to Sx) to which a signal is to be inputted from a source signal line driver circuit, while the other is connected to the gate electrode of an EL driving TFT 302 and to either one of the electrodes of a capacitor 303 which is provided in each pixel. The other electrode of the capacitor 303 is connected to a power supply line (V1 to Vx). Either one of the source and drain regions of the EL driving TFT 302 provided in each pixel is connected to the power supply line (V1 to Vx), while the other is connected to the other electrode of the EL element 304 provided in each pixel.

The EL element 304 has an anode, a cathode and an EL layer provided between the anode and the cathode. In the case where the anode of the EL element 304 is connected to the source region or the drain region of the EL driving TFT 302, the anode and the cathode of the EL element 304 become a pixel electrode and a counter electrode, respectively. Contrarily, in the case where the cathode of the EL element 304 is connected to the source region or the drain region of the EL driving TFT 302, the cathode and the anode of the EL element 304 become a pixel electrode and a counter electrode, respectively.

Incidentally, the potential of the counter electrode is herein called "counter potential", and a power source for applying the counter potential to the counter electrode is herein called "counter power source". The difference between the potential of the pixel electrode and the potential of the counter electrode is an EL driving voltage, and the EL driving voltage is applied to the EL layer.

As a gray scale display method for the above-described EL display device, there are an analog gray scale method and a time gray scale method.

First, the analog gray scale method for the EL display device will be described below. FIG. 4 is a timing chart showing the case where the display device shown in FIG. 3 is driven by the analog gray scale method. The period from the moment when one gate signal is selected until the moment when the next gate signal line is selected is herein called "one line period (L)". The period from the moment when one image is selected until the moment when the next image is selected corresponds to one frame period. In the case of the EL display device shown in FIG. 3, since the number of gate signal lines is "y", y-number of line periods (L1 to Ly) are provided in one frame period.

As the resolution of the EL display device becomes higher, the number of line periods for one frame period becomes larger, and the driver circuit of the EL display device must be driven at a higher frequency.

The power source lines (V1 to Vx) are kept at a constant voltage (power source potential). In addition, the counter potential is kept constant. The counter potential has a potential difference from the power source potential to such an extent that the EL elements emit light.

In the first line period (L1), a selection signal from the gate signal line driver circuit is inputted to the gate signal line G1. Then, analog video signals are inputted to the source signal lines (S1 to Sx) in this order.

Since all the switching TFTs 301 connected to the gate signal line G1 are turned on, the analog video signals which have been inputted to the source signal lines (S1 to Sx) are respectively inputted to the EL driving TFTs 302 via the switching TFTs 301.

According to the potential of the analog video signal inputted to each of the pixels when the switching TFT 301 is turned on, the gate voltage of the EL driving TFT 302 varies. At this time, the drain current of the EL driving TFT 302 is determined at a 1-to-1 ratio to the gate voltage thereof in accordance with the Id-Vg characteristic of the EL driving TFT 302. Specifically, according to the potential of the analog video signals inputted to the gate electrode of the EL driving TFT 302, the potential of the drain region of the EL driving TFT 302 (an EL driving voltage corresponding to the on state of the switching TFT 301) is determined and a predetermined drain current flows into the EL element 304, and the EL element 304 emits light at the amount of emission corresponding to the amount of the drain current.

When the above-described operations are repeated until the termination of inputting the analog video signals to the respective source signal lines (S1 to Sx), the first line period (L1) terminates. Incidentally, one line period may also be defined as the sum of the period required until the termination of inputting the analog video signals to the respective source signal lines (S1 to Sx) and a horizontal retrace period. Then, the second line period (L2) starts, and a selection signal is inputted to the gate signal line G2. Similarly to the first line period (L1), analog video signals are inputted to the source signal lines (S1 to Sx) in this order.

When selection signals are inputted to all the gate signal lines (G1 to Gy), all the line periods (L1 to Ly) terminate. When all the line periods (L1 to Ly) terminate, one frame period terminates. During one frame period, all the pixels perform displaying and one image is formed. Incidentally, one frame period may also be defined as the sum of all the line periods (L1 to Ly) and a vertical retrace period.

As described above, the amounts of emissions of the respective EL elements are controlled by the analog video signals, and gray scale display is provided by the control of the amounts of emissions. In this manner, in the analog gray scale method, gray scale display is carried out by the variations in the potentials of the respective analog video signals inputted to the source signal lines.

The time gray scale method will be described below.

In the time gray scale method, digital signals are inputted to pixels to select the emitting states or the non-emitting states of the respective EL elements, whereby gray scales are represented by the cumulation of periods per frame period during which each of the EL elements.

In the following description, $2^n$ gray scales (n is a natural number) are represented. FIG. 5 is a timing chart showing the case where the display device shown in FIG. 3 is driven by the time gray scale method. One frame period is divided into n-number of sub-frame periods ($SF_1$ to $SF_n$). Incidentally, the period for which all the pixels of the pixel portion displays one image is called "one frame period (F)". Plural periods into which one frame period is divided are called "sub-frame periods", respectively. As the number of gray scales increases, the number by which one frame period is divided also increases, and the driver circuit of the EL display device must be driven at a higher frequency.

One sub-frame period is divided into a write period (Ta) and a display period (Ts). The write period is the period for which digital signals are inputted to all the pixels during one sub-frame period, and the display period (also called "lighting period") is the period for which the respective EL display devices assume their emitting states or non-emitting states in accordance with the input digital signals, thereby performing displaying.

The EL driving voltage shown in FIG. 5 represents the EL driving voltage of an EL element for which emitting state is selected. Specifically, the EL driving voltage (FIG. 5) of the EL element for which emitting state is selected is 0 V during the write period, and has, during the display period, a magnitude which enables the EL element to emit light.

The counter potential is controlled by an external switch (not shown) so that the counter potential is kept at approximately the same level as the power source potential during the write period, and has, during the display period, a potential difference from the power source potential to such an extent that the EL element can emit light.

The write period and the display period of each sub-frame period will first be described in detail with reference to FIGS. 3 and 5, and subsequently, the time gray scale method will be described.

First, a gate signal is inputted to the gate signal line G1, and all the switching TFTs 301 connected to the gate signal line G1 are turned on. Then, digital signals are inputted to the source signal lines (S1 to Sx) in that order. The counter potential is kept at the same level as the potential of the power supply lines (V1 to Vx) (power source potential). Each of the digital signals has information of "0" or "1". Each of the digital signals of "0" or "1" means a signal which has a voltage of high level or low level.

Then, the digital signals which have been inputted to the source signal lines (S1 to Sx) are respectively inputted to the gate electrodes of the EL driving TFTs 302 via the switching TFTs 301 which are in the on state. The respective digital signals are also inputted to the capacitors 303.

Then, the above-described operations are repeated by inputting gate signals to the respective gate signal lines (G2 to Gy), whereby digital signals are inputted to all the pixels and the input digital signal is held in each of the pixels. The period required until the digital signals are inputted to all the pixels is called "write period".

When the digital signals are inputted to all the pixels, all the switching TFTs 301 are turned off. Thus, an external switch (not shown) connected to the counter electrode causes the counter potential to vary so that a potential difference which enables the EL element 304 to emit light is produced between the counter potential and the power source potential.

In the case where the digital signals have information of "0", the EL driving TFTs 302 are turned off and the EL elements 304 do not emit light. Contrarily, in the case where the digital signals have information of "1", the EL driving TFTs 302 are turned on. Consequently, the pixel electrodes of the respective EL elements 304 are kept at approximately the same potential as the power source potential, and the EL elements 304 emit light. In this manner, the emitting states or the non-emitting states of the EL elements 304 are selected in accordance with the information of the digital signals, and all the pixels perform displaying at the same time. When all the pixels perform display, an image is formed. The period for which the pixels perform displaying is called "display period".

The lengths of the write periods ($T_{a1}$ to $T_{an}$) of all the n-number of sub-frame periods ($SF_1$ to $SF_n$) are the same. The display periods (Ts) of the respective sub-frame periods ($SF_1$ to $SF_n$) are denoted by $T_{s1}$ to $T_{sn}$.

The lengths of the respective display periods are set to become $T_{s1}:T_{s2}:T_{s3}: \ldots :T_{s(n-1)}:T_{sn}=2^0:2^{-1}:2^2: \ldots : 2^{-(n-2)}:2^{-(n-1)}$, respectively. By combining the desired ones of these display periods, it is possible to provide display in the desired number of gray scales within $2^n$ gray scales.

The display period is any one of $T_{s1}$ to $T_{sn}$. Here, it is assumed that predetermined pixels are turned on for the period of $T_{s1}$.

Then, when the next write period starts and data signals are inputted to all the pixels, the next display period starts. At this time, the display period is any one of $T_{s2}$ to $T_{sn}$. Here, it is assumed that predetermined pixels are turned on for the period of $T_{s2}$.

It is assumed that the same operations are repeated as to the remaining (n−2)-number of sub-frames, whereby the display periods are set as $T_{s3}, T_{s4}, \ldots, T_{sn}$ in this order and predetermined pixels are turned on during each of the sub-frames.

When the n-number of sub-frame periods appear, one frame period terminates. At this time, the gray scale of a pixel is determined by cumulatively calculating the length of the display period for which the pixel has been turned on. For example; assuming that n=8 and the obtainable luminance in the case where the pixel emits light for all the display period is 100%, if the pixel emits light during $T_{s1}$ and $T_{s2}$, a luminance of 75% can be represented, and if $T_{s3}$, $T_{s5}$ and $T_{s8}$ are selected, a luminance of 16% can be realized.

Incidentally, in the driving method using the time gray scale method which represents gray scales by inputting n-bit digital signals, the number of plural sub-frame periods into which one frame period is divided, the lengths of the respective sub-frame periods and the like are not limited to the above-described examples.

The above-described analog gray scale method has problems to be described below.

The analog gray scale method has the problem that the unevenness of the characteristics of TFTs greatly affects gray scale display. For example, it is assumed that the Id-Vg characteristics of switching TFTs differ between two pixels which represent the same gray scale (the characteristic of either one of the pixels is shifted as a whole to a plus or minus side relative to the characteristic of the other).

In this case, the drain currents of the respective switching TFTs take different values, and gate voltages with different values are applied to the EL driving TFTs of the respective pixels. In other words, different amounts of currents flow into the EL elements of the respective pixels, and as a result, the amounts of emissions from the EL elements differ from each other and the same gray scale cannot be represented.

Even if equal gate voltages are applied to the EL driving TFTs of the respective pixels, the EL driving TFTs cannot output the same amount of drain current so long as the Id-Vg characteristics of the EL driving TFTs are not even. For this reason, if the Id-Vg characteristics of the switching TFTs slightly differ from each other, the amounts of currents outputted from the EL driving TFTs greatly differ from each other even when equal gate voltages are applied to the EL driving TFTs. As a result, owing to a slight unevenness of the Id-Vg characteristics, the amounts of emissions from the EL elements greatly differ between adjacent pixels even if signals of the same voltage are applied to the EL driving TFTs.

Gray scale display actually becomes far more non-uniform owing to a synergistic effect of the unevenness of the characteristics of the switching TFTs and the unevenness of the characteristics of the EL driving TFTs. Thus, analog gray scale display is extremely sensitive to the unevenness of the characteristics of TFTs. Accordingly, when this EL display device provides gray scale display, there is the problem that the display becomes considerably uneven.

The time gray scale method has a problem to be described below.

In the time gray scale method, the luminance of an EL element is represented by the time for which a current flows in the EL element and the EL element emits light. Accordingly, it is possible to greatly suppress the non-uniformity of display due to the unevenness of the characteristics of TFTs, which is a problem in the analog gray scale method. However, there is another problem.

The current which flows in the EL element is controlled by a voltage to be applied across both electrodes of the EL element (EL driving voltage). This EL driving voltage is a voltage obtained by subtracting the voltage across the drain and the source of an EL driving TFT from the potential difference between a power source potential and a counter potential. In order to avoid the influence of the non-uniformity of drain-source voltages due to the unevenness of the characteristics of EL driving TFTs and keep the EL driving voltage constant, the voltage across the drain and the source of the EL driving TFT is set to be far smaller than the EL driving voltage. At this time, the EL driving TFT is operating in a linear region.

In the TFT operation, the linear region corresponds to the operating region in which a voltage $V_{DS}$ across the drain and the source of the TFT is smaller than a gate voltage $V_{GS}$ of the TFT.

Here, the current flowing between both electrodes of the EL element is influenced by temperature. FIG. 17 is a graph showing the temperature characteristic of the EL element. From this graph, it is possible to know the amounts of currents which flow between both electrodes of the EL element with respect to voltages applied across both electrodes of the EL element at certain temperatures. A temperature $T_1$ is higher than a temperature $T_2$, and the temperature $T_2$ is higher than a temperature $T_3$. As can be seen from FIG. 17, even if the voltage applied across the both electrodes of the EL element in the pixel portion is the same, the current flowing between both electrodes of the EL element becomes larger owing to the temperature characteristic of the EL element as the temperature of the EL element becomes higher.

The luminance of the EL element is proportional to the amount of current flowing between both electrodes of the EL element.

In this manner, the time gray scale method has the problem that the current flowing between both electrodes of the EL element varies owing to variations in the environmental temperature at which the EL display device is used if a constant voltage is continuously applied across both electrodes of the EL element, and the luminance of the EL display device varies and accurate gray scale display becomes impossible.

In the active matrix type EL display device, for the above-described reasons, if the conventional analog gray scale method or time gray scale method is used, it is impossible to perform accurate gray scale display.

SUMMARY OF THE INVENTION

The invention provides a method of driving an EL display device, which enables accurate gray scale display and hence high-quality image display.

In accordance with the present invention, an active matrix type EL display device is driven by a time gray scale method. At this time, an EL driving TFT is operated in a saturation region to keep its drain current constant with respect to temperature variations.

Accordingly, it is possible to keep constant a current which flows between both electrodes of an EL element, with respect to the unevenness of the characteristics of TFTs and variations in environmental temperature, whereby it is possible to provide a method of driving an EL display device which method enables accurate gray scale display and hence high-quality image display.

The construction of the invention will be described below.

In accordance with the present invention, there is provided a method of driving a display device which includes pixels each having an EL element and a transistor, and the method includes the step of dividing one frame period into plural sub-frame periods and applying a first gate voltage or a second gate voltage to a gate electrode of the transistor during each of the plural sub-frame periods. When the first gate voltage is applied to the gate electrode of the transistor, a drain current of the transistor flows across both electrodes of the EL element and the EL element is placed into an emitting state, and when the second gate voltage is applied to the gate electrode of the transistor, the transistor is placed into a non-conductive state and the EL element is placed into a non-emitting state. An absolute value of the first gate voltage is not greater than an absolute value of a voltage across a drain and a source of the transistor.

In accordance with the present invention, there is provided a method of driving a display device which includes pixels each having an EL element, a transistor and a resistor, and the method includes the step of dividing one frame period into plural sub-frame periods and applying a first gate voltage or a second gate voltage to a gate electrode of the transistor during each of the plural sub-frame periods. When the first gate voltage is applied to the gate electrode of the transistor, a drain current of the transistor flows across the resistor and both electrodes of the EL element and the EL element is placed into an emitting state, and when the second gate voltage is applied to the gate electrode of the transistor, the transistor is placed into a non-conductive state and the EL element is placed into a non-emitting state. An absolute value of the first gate voltage is not greater than an absolute value of a voltage across a drain and a source of the transistor.

The method of driving a display device may be a method in which as the ratio of a gate width to a gate length of the transistor is smaller than 1, the absolute value of the first gate voltage applied to the gate electrode of the transistor is larger without exceeding the absolute value of the voltage across the drain and the source of the transistor.

The method of driving a display device may be a method in which the EL element enables color display by using an EL layer which emits light of one color, in combination with a color conversion layer.

The method of driving a display device may be a method in which the EL element enables color display by using an EL layer which emits white light, in combination with a color filter.

The method of driving a display device may be a method in which the EL layer of the EL element is made of a low molecular weight organic material or a polymeric organic material.

The method of driving a display device may be a method in which the low molecular weight organic material is Alq$_3$ (tris-8-quinolinolato-aluminum) or TPD (triphenylamine derivative).

The method of driving a display device may be a method in which the polymeric organic material is PPV (polyphenylene vinylene), PVK (poly(vinylcarbazole) or polycarbonate.

The method of driving a display device may be a method in which the EL layer of the EL element is an inorganic material.

The method of driving a display device may be used in a video camera, an image reproducing apparatus, a head-mounted display, a mobile telephone or a mobile information terminal.

BRIEF DESCRIPTION OF THE DRAWINGS

FIGS. 8A to 8C are views showing the process of fabricating an EL display device;

FIGS. 18A to 18E are views showing examples of electronic equipment provided with EL display devices using driving methods according to the invention.

DESCRIPTION OF THE PREFFERED EMBODIMENTS (Embodiment Mode)

An embodiment mode of the present invention will be described below in detail with reference to FIGS. 1A and 1B.

Figure 1A:
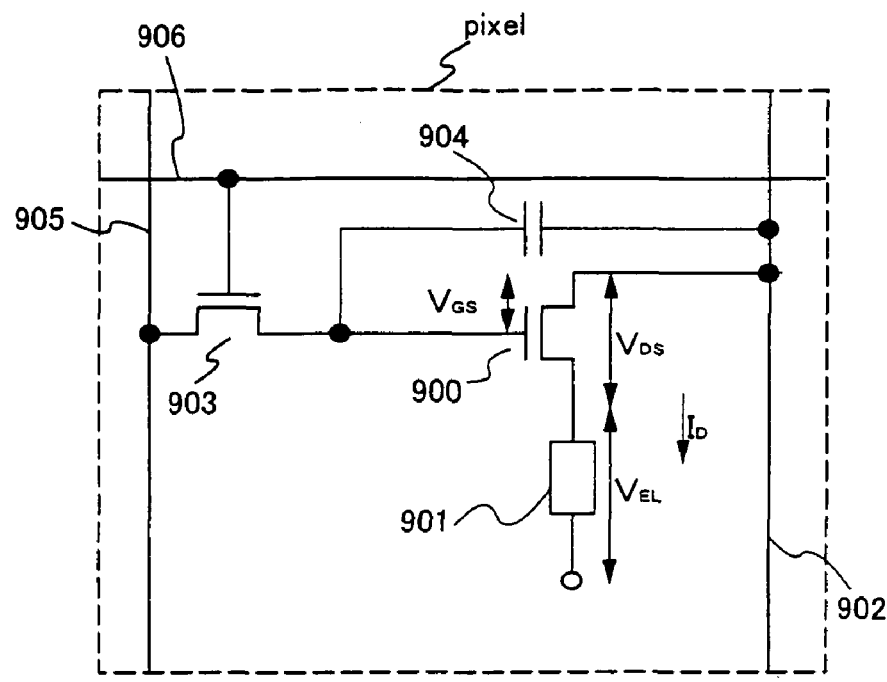
FIGS. 1A and 1B are views showing a method of driving a display device according to the invention.

FIG. 1A is a circuit diagram showing the construction of a pixel of an EL display device according to the present invention. The gate electrode of a switching TFT 903 is connected to a gate signal line 906. Either one of the source and drain regions of the switching TFT 903 is connected to a source signal line 905, while the other is connected to the gate electrode of an EL driving TFT 900 and to a capacitor 904. Either one of the source and drain regions of the EL driving TFT 900 is connected to a power supply line 902, while the other is connected to the anode or the cathode of the EL element 901.

Let $V_{GS}$ represent a voltage (gate voltage) applied across the gate and the source of the EL driving TFT 900 from the switching TFT 903. Let $V_{DS}$ represent a voltage (drain-source voltage) applied across the drain and the source of the EL driving TFT 900, and let $I_D$ represent a current (drain current) which flows between the drain and the source at this time. This drain current $I_D$ is inputted to the EL element 901. Letting $V_{EL}$ represent a voltage (EL driving voltage) applied across both electrodes of the EL element 901, a voltage $V_{IN}$ applied across a pixel portion (the counter electrode of the EL element 901) and a power supply line 902 is given as the sum of the drain-source voltage $V_{DS}$ and the EL driving voltage $V_{EL}$.

Figure 1B:
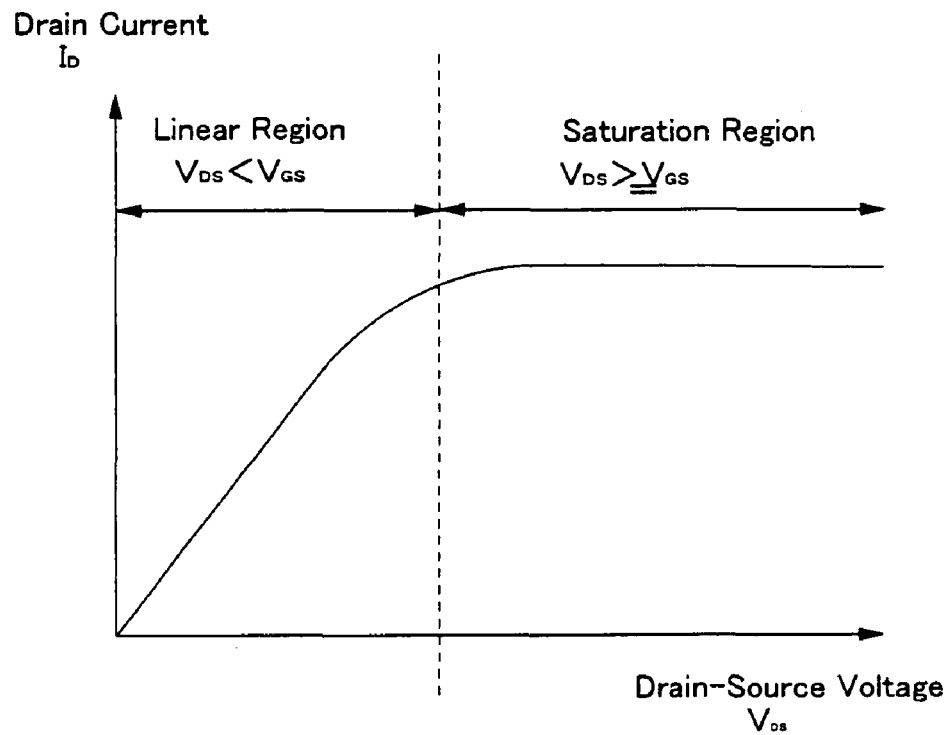

FIG. 1B is a graph showing the relationship between the drain-source voltage $V_{DS}$ and drain current $I_D$. The gate voltage $V_{GS}$ is constant. In this graph, the region in which the drain current $I_D$ has a one to one correspondence to the drain-source voltage $V_{DS}$ is called a linear region, which corresponds to the case in which the drain-source voltage $V_{DS}$ is small compared to the gate voltage $V_{GS}$. The region in which the drain current $I_D$ is approximately constant with respect to the drain-source voltage $V_{DS}$ is called a saturation region, which corresponds to the case in which the drain-source voltage $V_{DS}$ is greater than or equal to the gate voltage $V_{GS}$.

In the method of driving the EL display device with the conventional time gray scale method, control is executed so that the voltage applied across both electrodes of the EL element 901 is made constant. In this case, if the drain-source voltage $V_{DS}$ of the EL driving TFT 900 fluctuates owing to the unevenness of the characteristic of the TFT 900, the EL driving voltage $V_{EL}$ will be influenced. For this reason, in order to suppress the influence of such unevenness as greatly as possible, the drain-source voltage $V_{DS}$ of the EL driving TFT 900 is set smaller than the EL driving voltage $V_{EL}$ so that a major part of the voltage $V_{IN}$ inputted to the pixel can be applied across both electrodes of the EL element 901. Accordingly, the EL driving TFT 900 is made to operate in the linear region which corresponds to the case in which the drain-source voltage $V_{DS}$ is small compared to the gate voltage $V_{GS}$.

In the EL display device according to the present invention, the drain-source voltage $V_{DS}$ of the EL driving TFT 900 is set to the gate voltage $V_{GS}$ or more, and the EL driving TFT 900 is made to operate in the saturation region in which the constant drain current $I_D$ flows irrespective of the drain-source voltage $V_{DS}$. Accordingly, a constant current is consistently supplied to the EL element 901 irrespective of temperature changes.

Numerical examples of the voltages applied to the EL element 901 and the EL driving TFT 900 are as follows.

For example, the threshold voltage of the EL driving TFT 900 is made approximately 2V. In the case where the gate voltage $V_{GS}$ of the EL driving TFT 900 is made 5 V with the emitting state of the EL element 901 of the pixel being selected, the voltage between the counter electrode of the EL element 901 and the power supply line 902 (the difference between the counter potential and the power source potential) during the display period is made approximately 15 V. At this time, the voltage $V_{EL}$ across both electrodes of the EL element 901 takes a value of approximately 5–10 V, and the drain-source voltage $V_{DS}$ of the EL driving TFT 900 becomes approximately 5 V or more. At this time, the drain-source voltage $V_{DS}$ of the EL driving TFT 900 becomes the gate voltage $V_{GS}$ or more, and the EL driving TFT 900 operates in the saturation region.

In this manner, a constant current consistently flows in the EL element 901 irrespective of temperature changes, whereby the EL element 901 emits light at a constant luminance.

[Embodiments]

Embodiments of the invention will be described below.

(Embodiment 1)

Embodiment 1 relates to the method in the above description of the embodiment mode of the present invention, i.e., the method of operating the EL driving TFT in the saturation region to keep constant the drain current $I_D$ which flows across both electrodes of the EL element, and the following description of Embodiment 1 is a method of suppressing the influence of the unevenness of the characteristics of EL driving TFTs. The following description uses the same reference numerals and used in FIG. 1A as well as newly added ones.

In the case where the EL driving TFT 900 is operated in the saturation region, the following equation (1) is obtained:

$$I_D = \alpha(W/L)(V_{GS}-V_{th})^2 \tag{1}$$

In equation (1), $I_D$ is the drain current, $V_{GS}$ is the gate voltage, $V_{th}$ is the threshold voltage, W is the gate width, L is the gate length, and $\alpha$ is a constant. In this case, since the threshold voltage $V_{th}$ has variations, the drain current $I_D$ also has variations.

To suppress these variations, the W/L ratio of the gate width W to the gate length L is made small, while the gate voltage $V_{GS}$ is made large, within the range in which the EL driving TFT 900 operates in the saturation region. In this manner, it is possible to suppress the variations of the drain current $I_D$ due to the variations of the threshold voltage $V_{th}$ of the EL driving TFT 900.

For example, it is assumed that the threshold voltage $V_{th}$ takes a value of 2±0.1 V and has a 5% variation, and that the gate voltage $V_{GS}$ is 3 V when W/L is 8. When the value of the drain current $I_D$ at this time is calculated, the resultant value has an about 20% variation.

Here, let $I_O$ be the average value of the drain current $I_D$. If W/L is made 0.5, the gate voltage $V_{GS}$ needs to be made about 6 V so that the average value $I_O$ of the drain current $I_D$ is made the same as when W/L is 8. According to the calculation of the value of the drain current $I_D$ for the gate voltage $V_{GS}$ of 6 V, it is possible to suppress the variation of the value to an about 5% variation.

In this manner, it is desirable to make the value of W/L less than 1, preferably 0.5 or less.

(Embodiment 2)

Embodiment 2 relates to the method in the above description the embodiment mode of the present invention, i.e., the method of operating the EL driving TFT in the saturation region to keep constant the drain current $I_D$ which flows across both electrodes of the EL element, and the following description of Embodiment 2 is a method of suppressing the influence of the unevenness of the characteristics of EL driving TFTs by a method different from that used in Embodiment 1.

Figure 2:
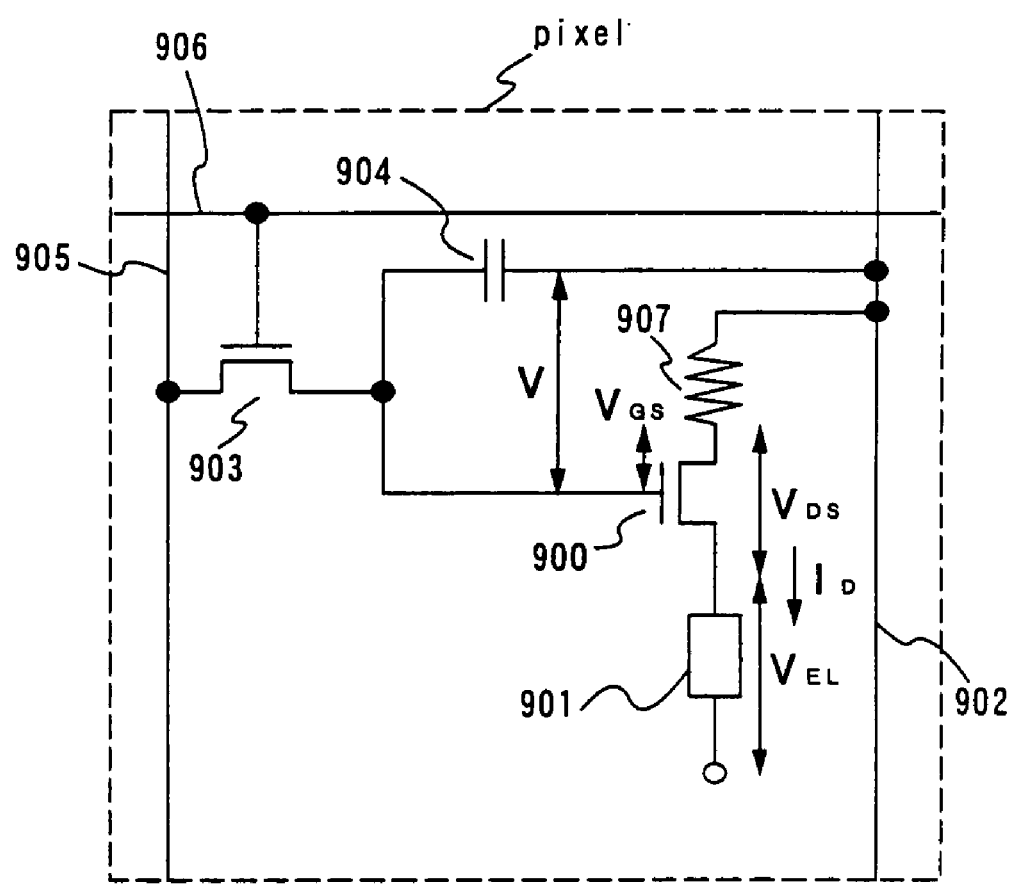
FIG. 2 is a view showing the construction of a pixel portion of a display device using the driving method according to the invention.
Figure 3:
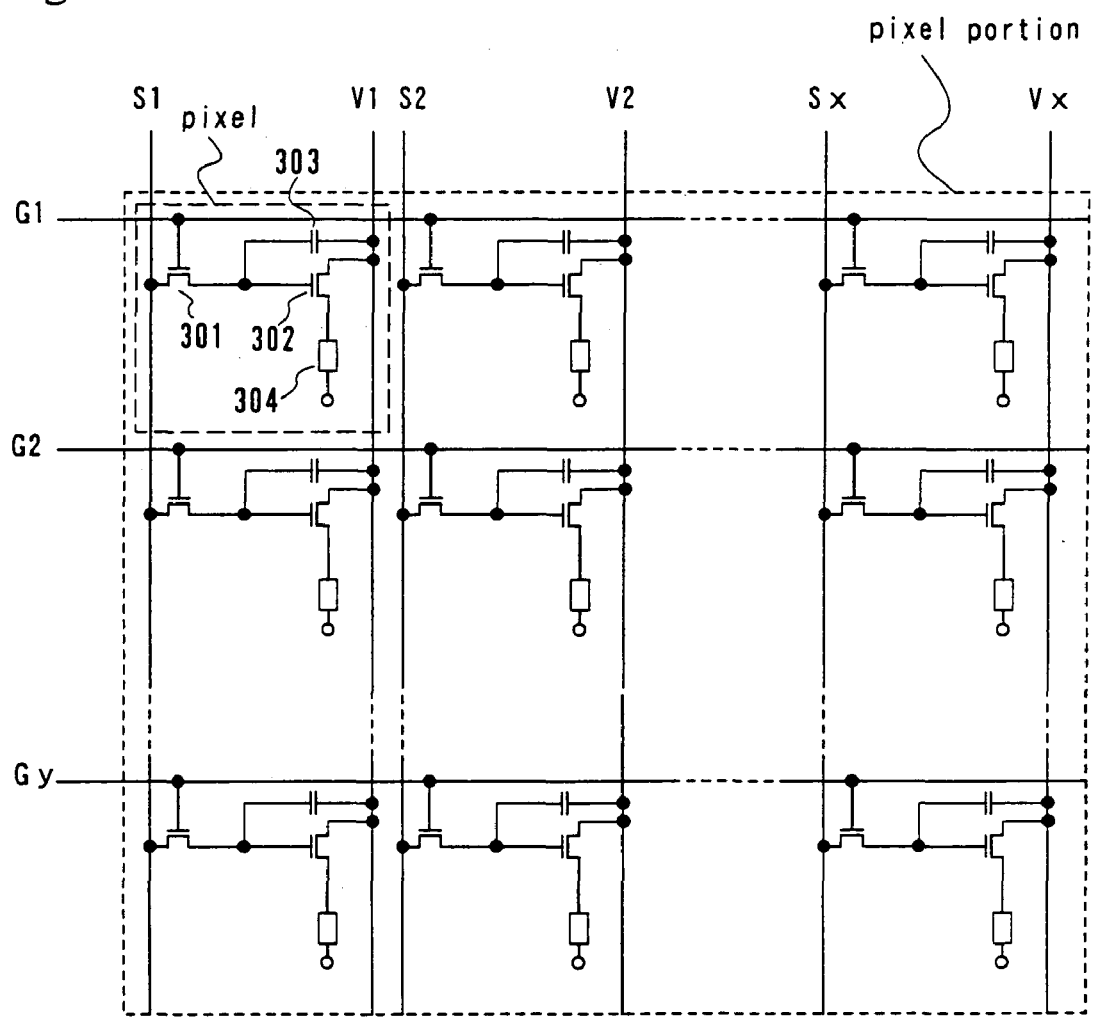
FIG. 3 is a view showing the construction of a pixel portion of an EL display device.
Figure 4:
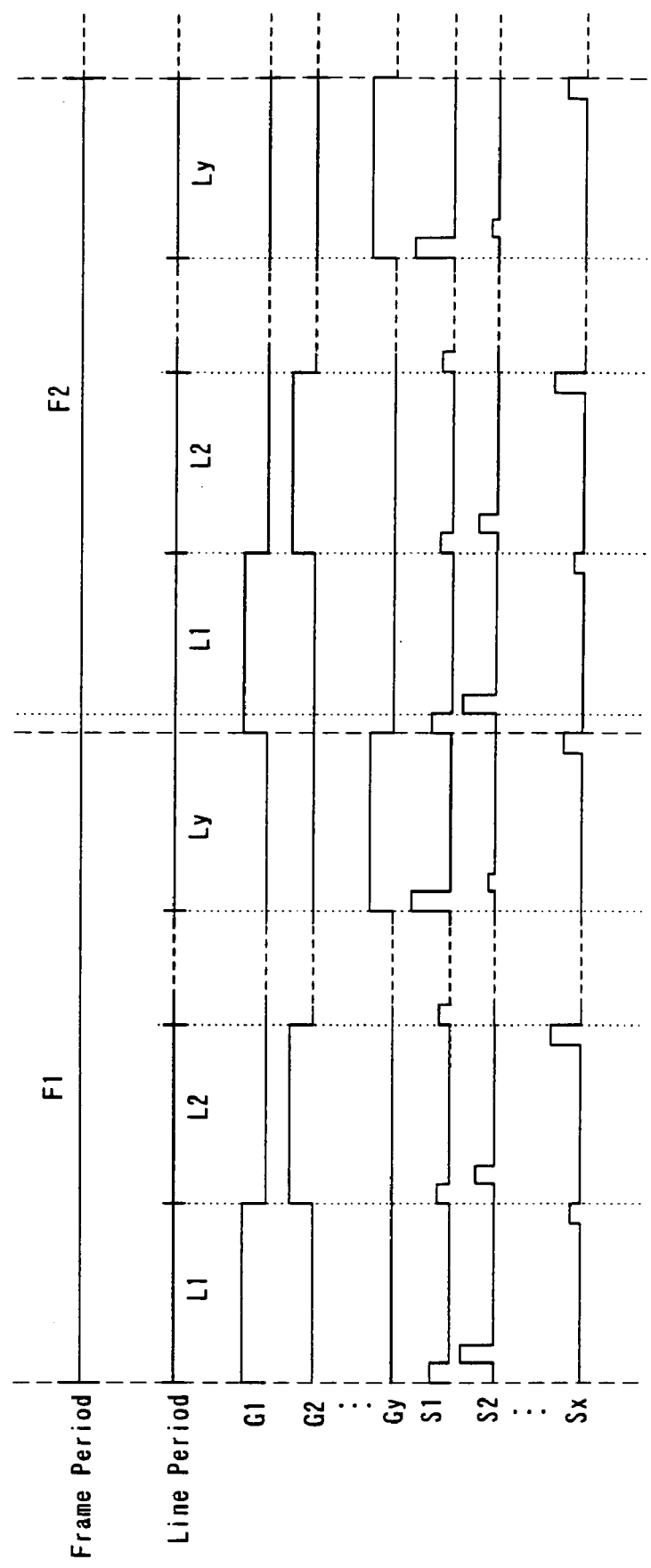
FIG. 4 is a timing chart showing a method of driving a related art EL display device.
Figure 5:
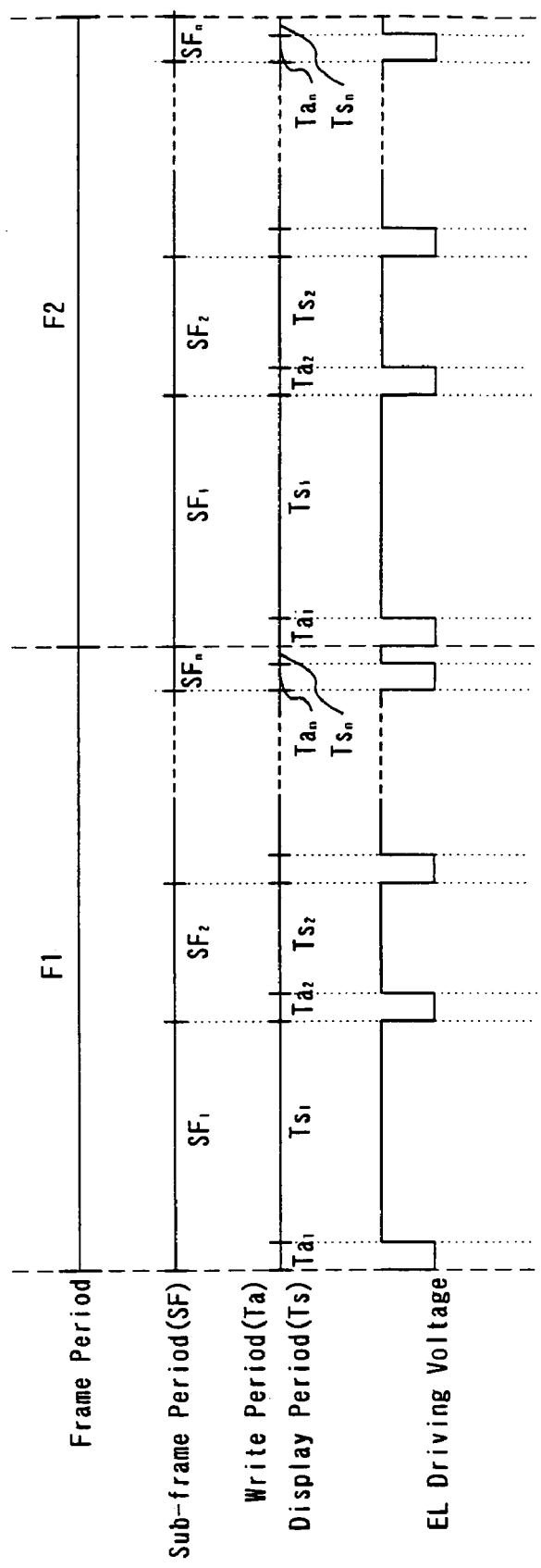
FIG. 5 is a timing chart showing a method of driving an EL display device.

FIG. 2 is a circuit diagram showing the construction of a pixel portion of an EL display device according to Embodiment 2. The pixel portion shown in FIG. 2 is the same in basic structure as that shown in FIG. 1A, and in the following description, the modified portions of the construction shown in FIG. 1A are denoted by different reference numerals.

The gate electrode of the switching TFT 903 is connected to the gate signal line 906. Either one of the source and drain regions of the switching TFT 903 is connected to the source signal line 905, while the other is connected to the gate electrode of the EL driving TFT 900 and to either one of the electrodes of the capacitor 904. The other electrode of the capacitor 904 is connected to the power supply line 902. Either one of the source region and the drain region of the EL driving TFT 900 is connected to the power supply line 902 via a resistor 907, while the other is connected to the anode or the cathode of the EL element 901.

In the case of the construction of the pixel according to Embodiment 2, the equation (1) shown in Embodiment 1 and the following equation (2) are satisfied at the same time:

$$V = V_{GS} + RI_D \tag{2}$$

In equation (2), V is a potential difference given between the gate electrode of the EL driving TFT 900 and the power supply line 902, and R is the resistance value of the resistor 907.

The gate voltage $V_{GS}$ and the drain current $I_D$, in the case where the resistor 907 is disposed as shown in FIG. 2, are found from equations (1) and (2). At this time, the variation of the drain current $I_D$ relative to the variation of the threshold voltage $V_{th}$ is calculated.

For example, in equations (1) and (2), it is assumed that $\alpha$ is $2\times10^{-6}$ F/V·s and W/L is 1, and that $V_{th}$ takes a value of $2\pm0.1$ V and has a 5% variation.

First, consideration is given to the case where R=0 (the resistor 907 is absent). If V is 4 V, the gate voltage $V_{GS}$ coincides with V at 4 V. The variation of the drain current $I_D$ at this time is about 10%. At this time, the average value of the drain current $I_D$ is about $8\times10^{-6}$ A.

Then, consideration is given to the case where $R=1\times10^6$ $\Omega$. To hold the average value of the drain current $I_D$ at about $8\times10^{-6}$ A, V is made 12 V. At this time, the variation of the drain current $I_D$ relative to the variation of the threshold voltage $V_{th}$ is suppressed to about 1%.

Then, consideration is given to the case where $R=2\times10^6$ $\Omega$. To hold the average value of the drain current $I_D$ at about $8\times10^{-6}$ A, V is made 20 V. At this time, the variation of the drain current $I_D$ relative to the variation of the threshold voltage $V_{th}$ is suppressed to about 0.6%.

In this manner, with disposing the resistor 907 and setting its resistance value large, it is possible to suppress the variation of the drain current $I_D$ relative to the variation of the threshold voltage $V_{th}$.

Embodiment 2 can be freely carried out in combination with Embodiment 1.

(Embodiment 3)

Note that a description is set forth regarding a step for fabricating TFTs for driver circuit (a source signal line driver circuit and a gate signal line driver circuit) provided in the pixel portion of a display device using the driver method of the present invention and periphery portion of the pixel portion. For the simplicity of the explanation, a CMOS circuit is shown in figures, which is a fundamental structure circuit for the driver circuit portion.

First, as shown in FIG. 8A, a base film 5002 made of an insulating film such as a silicon oxide film, a silicon nitride film, or a silicon oxynitride film, is formed on a substrate 5001 made of a glass such as barium borosilicate glass or aluminum borosilicate glass, typically a glass such as Corning Corp. #7059 glass or #1737 glass. For example, a lamination film of a silicon oxynitride film 5002a, manufactured from $SiH_4$, $NH_3$, and $N_2O$ by plasma CVD, and formed having a thickness of 10 to 200 nm (preferably between 50 and 100 nm), and a hydrogenated silicon oxynitride film 5002b, similarly manufactured from $SiH_4$ and $N_2O$, and formed having a thickness of 50 to 200 nm (preferably between 100 and 150 nm), is formed. A two layer structure is shown for the base film 5002 in Embodiment 3, but a single layer film of the insulating film, and a structure in which more than two layers are laminated, may also be formed.

Island shape semiconductor layers 5003 to 5006 are formed by crystalline semiconductor films made from a semiconductor film having an amorphous structure, using a laser crystallization method or a known thermal crystallization method. The thickness of the island shape semiconductor layers 5003 to 5006 may be formed from 25 to 80 nm (preferably between 30 and 60 nm). There are no limitations placed on the materials for forming a crystalline semiconductor film, but it is preferable to form the crystalline semiconductor films by silicon or a silicon germanium (SiGe) alloy.

A laser such as a pulse oscillation type or continuous light emission type excimer laser, a YAG laser, or a $YVO_4$ laser can be used to fabricate the crystalline semiconductor films by the laser crystallization method. A method of condensing laser light emitted from a laser oscillator into a linear shape by an optical system and then irradiating the light to the semiconductor film may be used when these types of lasers are used. The crystallization conditions may be suitably selected by the operator, but when using the excimer laser, the pulse oscillation frequency is set to 30 Hz, and the laser energy density is set form 100 to 400 mJ/cm$^2$ (typically between 200 and 300 mJ/cm$^2$). Further, when using the YAG laser, the second harmonic is used and the pulse oscillation frequency is set from 1 to 10 kHz, and the laser energy density may be set from 300 to 600 mJ/cm$^2$ (typically between 350 and 500 mJ/cm$^2$). The laser light condensed into a linear shape with a width of 100 to 1000 µm, for example 400 µm, is then irradiated over the entire surface of the substrate. This is performed with an overlap ratio of 80 to 98% for the linear laser light.

A gate insulating film 5007 is formed covering the island shape semiconductor layers 5003 to 5006. The gate insulating film 5007 is formed of an insulating film containing silicon with a thickness of 40 to 150 nm by plasma CVD or sputtering. A 120 nm thick silicon oxynitride film is formed in Embodiment 3. The gate insulating film is not limited to this type of silicon oxynitride film, of course, and other insulating films containing silicon may also be used in a single layer or in a lamination structure. For example, when using a silicon oxide film, it can be formed by plasma CVD with a mixture of TEOS (tetraethyl orthosilicate) and $O_2$, at a reaction pressure of 40 Pa, with the substrate temperature set from 300 to 400° C., and by discharging at a high frequency (13.56 MHZ) electric power density of 0.5 to 0.8 W/cm$^2$. Good characteristics as a gate insulating film can be obtained by subsequently performing thermal annealing, at between 400 and 500° C., of the silicon oxide film thus manufactured.

A first conductive film 5008 and a second conductive film 5009 are then formed on the gate insulating film 5007 in order to form gate electrodes. The first conductive film 5008 is formed of a Ta film with a thickness of 50 to 100 nm, and the second conductive film 5009 is formed of a W film having a thickness of 100 to 300 nm, in Embodiment 3.

The Ta film is formed by sputtering, and sputtering of a Ta target is performed by Ar. If appropriate amounts of Xe and Kr are added to Ar, the internal stress of the Ta film is relaxed, and film peeling can be prevented. The resistivity of an $\alpha$ phase Ta film is about 20 µΩcm, and it can be used in the gate electrode, but the resistivity of a $\beta$ phase Ta film is about 180 µΩ cm and it is unsuitable for the gate electrode. The $\alpha$ phase Ta film can easily be obtained if a tantalum nitride film, which possesses a crystal structure similar to that of $\alpha$ phase Ta, is formed with a thickness of about 10 to 50 nm as a base for a Ta film in order to form the $\alpha$ phase Ta film.

The W film is formed by sputtering with a W target, which can also be formed by thermal CVD using tungsten hexafluoride ($WF_6$). Whichever is used, it is necessary to make the film become low resistance in order to use it as the gate electrode, and it is preferable that the resistivity of the W film be made equal to or less than 20 µΩcm. The resistivity can be lowered by enlarging the crystal grains of the W film, but for cases in which there are many impurity elements such as oxygen within the W film, crystallization is inhibited, thereby the film becomes high resistance. A W target having a purity of 99.9999% is thus used in sputtering. In addition, by forming the W film while taking sufficient care that no impurities from the gas phase are introduced at the time of film formation, the resistivity of 9 to 20 μΩcm can be achieved.

Note that, although the first conductive film 5008 is a Ta film and the second conductive film 5009 is a W film in Embodiment 3, both may also be formed from an element selected from the group consisting of Ta, W, Ti, Mo, Al, and Cu, or from an alloy material having one of these elements as its main constituent, and a chemical compound material. Further, a semiconductor film, typically a polycrystalline silicon film into which an impurity element such as phosphorus is doped, may also be used. Examples of preferable combinations other than that used in Embodiment 3 include: forming the first conductive film 5008 by tantalum nitride (TaN) and combining it with the second conductive film 5009 formed from a W film; forming the first conductive film 5008 by tantalum nitride (TaN) and combining it with the second conductive film 5009 formed from an Al film; and forming the first conductive film 5008 by tantalum nitride (TaN) and combining it with the second conductive film 5009 formed from a Cu film.

Then, mask 5010 are formed from resist, and a first etching treatment is performed in order to form electrodes and wirings. An ICP (inductively coupled plasma) etching method is used in Embodiment 3. A gas mixture of $CF_4$ and $Cl_2$ is used as an etching gas, and a plasma is generated by applying a 500 W RF electric power (13.56 MHZ) to a coil shape electrode at 1 Pa. A 100 W RF electric power (13.56 MHZ) is also applied to the substrate side (test piece stage), effectively applying a negative self-bias voltage. In case of mixing $CF_4$ and $Cl_2$, the W film and the Ta film are etched to the approximately same level.

Edge portions of the first conductive layer and the second conductive layer are made into a tapered shape in accordance with the effect of the bias voltage applied to the substrate side under the above etching conditions by using a suitable resist mask shape. The angle of the tapered portions is from 15 to 45°. The etching time may be increased by approximately 10 to 20% in order to perform etching without any residue remaining on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 5011 to 5016 (first conductive layers 5011a to 5016a and second conductive layers 5011b to 5016b) are thus formed of the first conductive layers and the second conductive layers in accordance with the first etching process. Reference numeral 5007 denotes a gate insulating film, and the regions not covered by the first shape conductive layers 5011 to 5016 are made thinner by etching of about 20 to 50 nm.

A first doping process is then performed, and an impurity element which imparts n-type conductivity is added. Ion doping or ion injection may be performed for the method of doping. Ion doping is performed under the conditions of a dose amount of from $1\times10^{13}$ to $5\times10^{14}$ atoms/cm$^2$ and an acceleration voltage of 60 to 100 keV. A periodic table group 15 element, typically phosphorus (P) or arsenic (As) is used as the impurity element which imparts n-type conductivity, and phosphorus (P) is used here. The conductive layers 5011 to 5015 become masks with respect to the n-type conductivity imparting impurity element in this case, and first impurity regions 5017 to 5025 are formed in a self-aligning manner. The impurity element which imparts n-type conductivity is added to the first impurity regions 5017 to 5025 with a concentration in the range of $1\times10^{20}$ to $1\times10^{21}$ atoms/cm$^3$. (FIG. 8B)

A second etching process is performed next without removing a resist mask, as shown in FIG. 8C. The W film is etched selectively using a mixture of $CF_4$, $Cl_2$, and $O_2$ as a etching gas. The second shape conductive layers 5026 to 5031 (first conductive layers 5026a to 5031a and second conductive layers 5026b to 5031b) are formed by second etching process. Reference numeral 5007 denotes a gate insulating film, and regions not covered by the second shape conductive layers 5026 to 5031 are additionally etched on the order of 20 to 50 nm, forming thinner regions.

The etching reaction of a W film or a Ta film in accordance with a mixed gas of $CF_4$ and $Cl_2$ can be estimated from the radicals generated and from the ion types and vapor pressures of the reaction products. Comparing the vapor pressures of fluorides and chlorides of W and Ta, the W fluoride compound $WF_6$ is extremely high, and the vapor pressures of $WCl_5$, $TaF_5$, and $TaCl_5$ are of similar order. Therefore the W film and the Ta film are both etched by the $CF_4$ and $Cl_2$ gas mixture. However, if a suitable quantity of $O_2$ is added to this gas mixture, $CF_4$ and $O_2$ react, forming CO and F, and a large amount of F radicals or F ions is generated. As a result, the etching speed of the W film having a high fluoride vapor pressure is increased. On the other hand, even if F increases, the etching speed of Ta does not relatively increase. Further, Ta is easily oxidized compared to W, and therefore the surface of Ta is oxidized by the addition of $O_2$. The etching speed of the Ta film is further reduced because Ta oxides do not react with fluorine and chlorine. Therefore, it becomes possible to have a difference in etching speeds between the W film and the Ta film, and it becomes possible to make the etching speed of the W film larger than that of the Ta film.

Figure 9A:
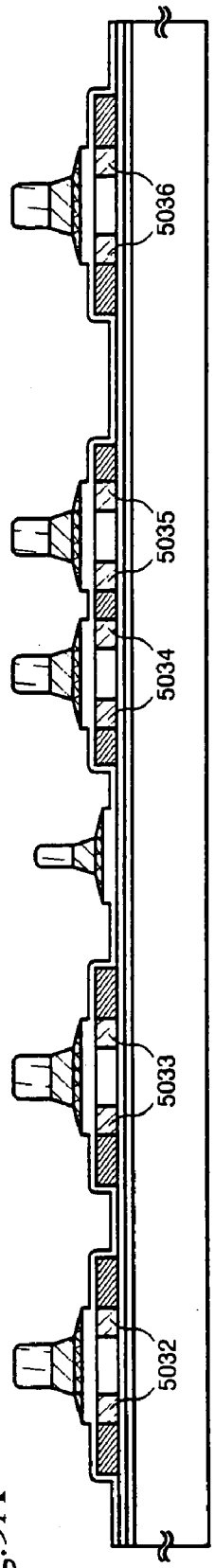
FIGS. 9A, 9B and 9C are views showing the process of fabricating the EL display device.

A second doping process is then performed, as shown in FIG. 9A. The dose amount is smaller than that of the first doping process in this case, and an impurity element which imparts n-type conductivity is doped under high acceleration voltage conditions. For example, doping performed with the acceleration voltage set from 70 to 120 keV, and a dose amount of $1\times10^{13}$ atoms/cm$^3$, and a new impurity region is formed inside the first impurity region is formed inside the first impurity region formed in the island shape semiconductor layers of FIG. 8B. The second conductive layers 5026 to 5030 are used as masks with respect to the impurity element, and doping is performed so as to also add the impurity element into regions under the first conductive layers 5026a to 5030a. A concentration of phosphorus (P) added to third impurity regions 5032 to 5036 is provided with a gradual concentration gradient in accordance with a film thickness of the taper portion of the first conductive layers 5026a to 5030a. Further, in the semiconductor layer overlapping the taper portion of the first conductive layers 5026a to 5030a, from an end portion of the taper portion of the second conductive layer toward an inner side, the impurity concentration is more or less reduced, however, the concentration stays to be substantially the same degree.

Figure 9B:
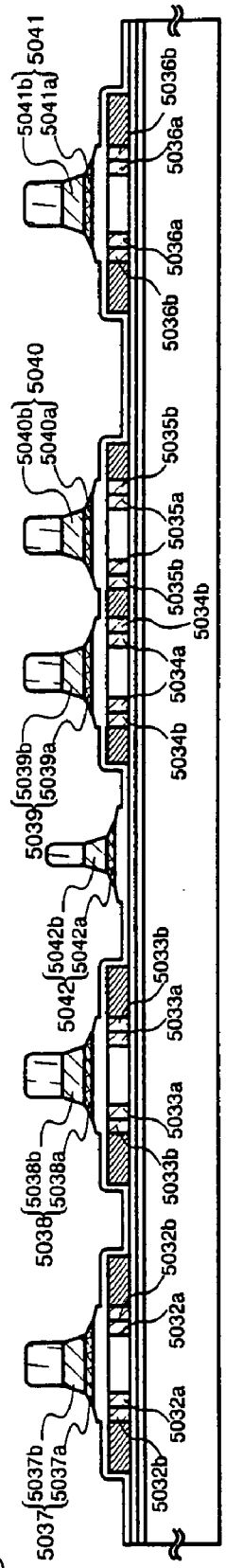

A third etching process is carried out as shown in FIG. 9B. The third etching is carried out by using $CHF_6$ for an etching gas and using a reactive ion etching process (RIE process). The third etching process is carried out for partially etching a taper portion of the first conductive layers 5026a to 5031a and reducing a region overlapping the semiconductor layer.

By the third etching, there are formed third conductive layers 5037 through 5042 (first conductive layers 5037a to 5042a and second conductive layers 5037b to 5042b). Reference numeral 5007 denotes a gate insulating film, and regions not covered by the third shape conductive layers 5037 to 5042 are additionally etched on the order of 20 to 50 nm, forming thinner regions.

By the third etching, there are formed third impurity regions 5032a to 5036a overlapping the first conductive layers 5037a to 5041a in third impurity regions 5032 to 5036. Second impurity regions 5032b to 5036b between first impurity region and third impurity region.

Figure 9C:
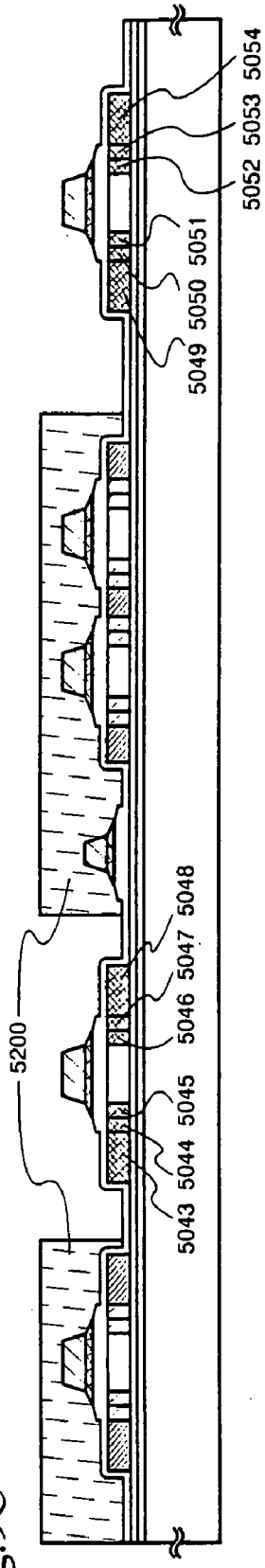

Fourth impurity regions 5043 to 5054 added with an impurity element having a conductivity type which is the opposite of the first conductivity type impurity element, are then formed as shown in FIG. 9C in the island shape semiconductor layers 5004, 5006 which form p-channel TFTs. The third shaped conductive layers 5038b to 5041b is used as a mask with respect to the impurity element, and the impurity regions are formed in a self-aligning manner. The island shape semiconductor layers 5003, 5005 and wiring portion 5042 which form n-channel TFTs, are covered over their entire surface areas by resist mask 5200. Phosphorus is added to the impurity regions 5043 to 5054 at a different concentration, and ion doping is performed here using diborane ($B_2H_6$), so that the respective impurity regions have the impurity concentration of $2\times10^{20}$ to $2\times10^{21}$ atoms/cm$^3$.

Impurity regions are formed in the respective island shape semiconductor layers by the above processes. The third shaped conductive layers 5037 to 5041 overlapping the island shape semiconductor layers function as gate electrodes. The reference numeral 5042 functions as an island shape source signal line.

A process of activating the impurity elements added to the respective island shape semiconductor layers is then performed with the aim of controlling conductivity type after removing the resist mask 5200. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen atmosphere at 400 to 700° C., typically between 500 and 600° C. Heat treatment is performed for 4 hours at 500° C. in Embodiment 3. However, for cases in which the wiring material used in the third conductive layers 5037 to 5042 is weak with respect to heat, it is preferable to perform activation after forming an interlayer insulating film (having silicon as its main constituent) in order to protect the wirings and the like.

In addition, heat treatment is performed for 1 to 12 hours at 300 to 450° C. in an atmosphere containing between 3 and 100% hydrogen, performing hydrogenation of the island shape semiconductor layers. This process is one of terminating dangling bonds in the island shape semiconductor layers by hydrogen which is thermally excited. Plasma hydrogenation (using hydrogen excited by a plasma) may also be performed as another means of hydrogenation.

Figure 10A:
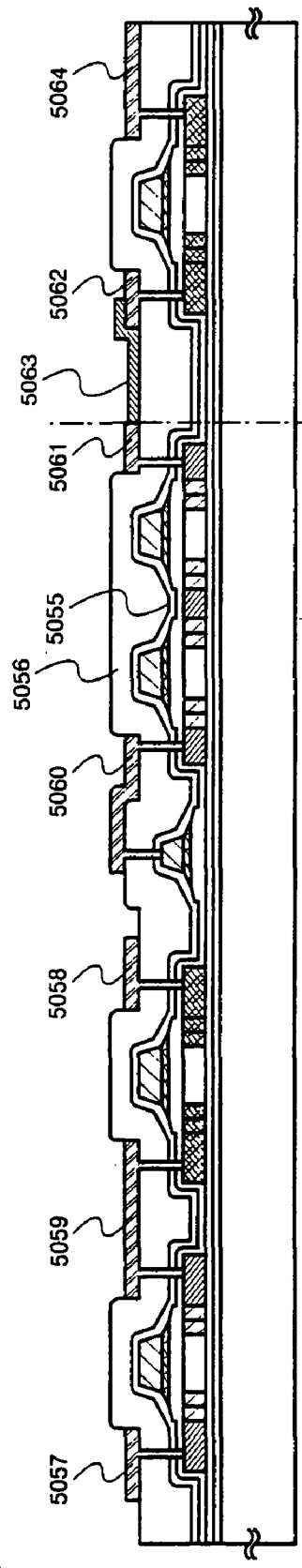
FIGS. 10A and 10B are views showing the process of fabricating the EL display device.

As shown in FIG. 10A, a first interlayer insulating film 5055 is formed next of a silicon oxynitride film having a thickness of 100 to 200 nm. A second interlayer insulating film 5056 made of an organic insulating material is then formed on the first interlayer insulating film 5055. After that, the first interlayer film, the second interlayer 5056 and the contact hole for the gate insulating film 5007 are formed. The pixel electrode 5063 which is contact to the connect wiring 5062 is patterned to formed after forming each wirings (including connect wiring and signal wiring) 5057 to 5062 and 5064.

As the second interlayer insulating film 5056, a film made of organic resin is used, and as the organic resin, polyimide, polyamide, acrylic, BCB (benzocyclobutene) or the like can be used. Especially, since the second interlayer insulating film 5056 has rather the meaning of flattening, acrylic excellent in flatness is desirable. In this embodiment, an acrylic film is formed to such a thickness that stepped portions formed by the TFTs can be adequately flattened. It is appropriate that the thickness is preferably made 1 to 5 μm (most preferably 2 to 4 μm).

The formation of the contact holes are performed by dry etching or wet etching. Contact holes reaching the n-type impurity regions 5017, 5018, 5021 and 5023 or the p-type impurity regions 5043 to 5054, a contact hole reaching to a wiring 5042, a contact hole reaching electric current supply line (not shown), and a contact hole (not shown) reaching a gate electrode are formed, respectively.

Besides, as the wirings (including connect wiring and signal wiring) 5057 to 5062, and 5064, a lamination film of three-layer structure is used, in which a Ti film with a thickness of 100 nm, an aluminum film containing Ti with a thickness of 300 nm, and a Ti film with a thickness of 150 nm are continuously formed by sputtering into one is patterned into a desired shape. Of course, the other conductive film may be used.

Further, in Embodiment 3, an ITO film with a thickness of 110 nm is formed as a pixel electrode 5063, and then subjected to patterning. A contact is obtained by arranging the pixel electrode 5063 so as to overlap with the connect wiring 5062 while contacting therewith. Besides, a transparent conductive film in which 2 to 20% of zinc oxide is mixed with indium oxide may be used. This pixel electrode 5063 becomes an anode of an EL element (FIG. 10A).

Figure 10B:
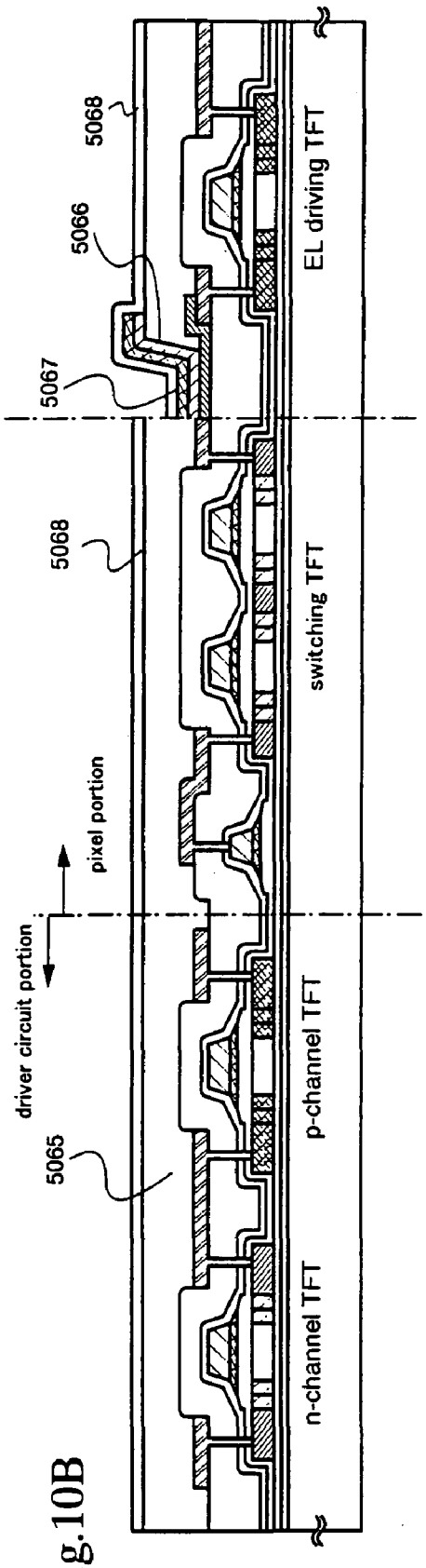

Then, as shown in FIG. 10B, an insulating film containing silicon (silicon oxide film in Embodiment 3) is formed into a thickness of 500 nm, and an opening is formed at a position corresponding to the pixel electrode 5063 to form the third interlayer insulating film 5065. Upon the formation of the opening, taper-shape side walls can easily be formed by using a wet etching method. If the side walls of the opening is sufficiently smooth, degradation of the EL layer caused by the step becomes a remarkable problem.

Then, an EL layer 5066 and a cathode (MgAg electrode) 5067 are continuously formed by vapor deposition without exposing them to the atmosphere. Note that the thickness of the EL layer 5066 is preferably set as 80 to 200 nm (typically 100 to 120 nm), and the thickness of the cathode 5067 is preferably set as 180 to 300 nm (typically 200 to 250 nm).

In this step, the EL layer and the cathode are sequentially formed with respect to the pixels corresponding to a red color, a green color, and a blue color, respectively. Note that, the EL layer lacks withstand property against solutions, and therefore the respective colors must be formed individually without using a photolithography technology. For that reason, it is preferred that portions other than desired pixels are masked using metallic masks, and the EL layer and the cathode are selectively formed only for the necessary portions.

In other words, a mask for masking all the portions except the pixels corresponding to a red color is first set, and the EL layer emitting a red color and the cathode are selectively formed using the mask. Then, a mask for masking all the portions except the pixels corresponding to a green color is set, and the EL layer emitting a green color and the cathode are selectively formed using the mask. Succeedingly, similarly, a mask for masking all the portions except the pixels corresponding to a blue color is set, and the EL layer emitting a blue color and the cathode are selectively formed using the mask. Note that, in this case, a description is made such that a different mask is used for each case, however, the same mask may be used for all the cases.

Employed in this case is a system in which three kinds of EL elements corresponding to RGB are formed. However, the following systems may be used: a system in which an EL element emitting a white color and a color filter are combined; a system in which an EL element emitting a blue or blue-green color and a fluorescing body (fluorescing color conversion layer: CCM) are combined; and a system in which a transparent electrode is used for a cathode (opposing electrode) and an EL element corresponding to the RGB is overlapped therewith.

Note that known materials may be used for the EL layer 5066. As the known materials, organic materials are preferably used when taking a driver voltage into an account. For example, a four-layer structure consisting of a hole injection layer, a hole transport layer, a light emitting layer, and an electron injection layer may be used as the EL layer.

Next, the cathode 5067 is formed using a metal mask on the pixels having the switching TFTs of which the gate electrodes are connected to the same gate signal line (pixels on the same line). Note that, in Embodiment 3, although MgAg is used as the cathode 5067, the present invention is not limited to this. Other known materials may be used for the cathode 5067.

Finally, a passivation film 5068 made from a silicon nitride film is formed into a thickness of 300 nm. By forming the passivation film 5068, the EL layer 5066 can be protected from moisture, etc., and the reliability of the EL element may be enhanced.

Consequently, the EL display device with the structure as shown in FIG. 10B is completed. Note that, in the manufacturing process of the EL display in Embodiment 3, the source signal lines are formed from Ta and W, which are materials for forming gate electrodes, and the gate signal lines are formed from Al, which is a wiring material for forming drain/source electrode, but different materials may be used.

Incidentally, the EL display device in Embodiment 3 exhibits the very high reliability and has the improved operational characteristic by providing TFTs having the most suitable structure in not only the pixel portion but also the driver circuit portion. Further, it is also possible to add a metallic catalyst such as Ni in the crystallization process, thereby increasing crystallinity. It therefore becomes possible to set the driving frequency of the source signal line driver circuit to 10 MHZ or higher.

First, a TFT having a structure in which hot carrier injection is reduced without decreasing the operating speed as much as possible is used as an n-channel TFT of a CMOS circuit forming the driver circuit portion. Note that the driver circuit referred to here includes circuits such as a shift register, a buffer, a level shifter, a latch in line-sequential drive, and a transmission gate in dot-sequential drive.

In Embodiment 3, the active layer of the n-channel TFT contains the source region, the drain region, the LDD region overlapping with the gate electrode with the gate insulating film sandwiched therebetween (Lov region), the LDD region not overlapping with the gate electrode with the gate insulating film sandwiched therebetween (Loff region), and the channel forming region.

Further, there is not much need to worry about degradation due to the hot carrier injection with the p-channel TFT of the CMOS circuit, and therefore LDD regions may not be formed in particular. It is of course possible to form LDD regions similar to those of the n-channel TFT, as a measure against hot carriers.

In addition, when using a CMOS circuit in which electric current flows in both directions in the channel forming region, namely a CMOS circuit in which the roles of the source region and the drain region interchange, it is preferable that LDD regions be formed on both sides of the channel forming region of the n-channel TFT forming the CMOS circuit, sandwiching the channel forming region. A circuit such as a transmission gate used in dot-sequential drive can be given as an example of such. Further, when a CMOS circuit in which it is necessary to suppress the value of the off current as much as possible is used, the n-channel TFT forming the CMOS circuit preferably has an Lov region. A circuit such as the transmission gate used in dot-sequential drive can be given as an example of such.

Note that, in practice, it is preferable to perform packaging (sealing), without exposure to the atmosphere, using a protecting film (such as a laminated film or an ultraviolet cured resin film) having good airtight properties and little outgassing, or a transparent sealing material, after completing through the state of FIG. 10B. At this time, the reliability of the EL element is increased by making an inert atmosphere on the inside of the sealing material and by arranging a drying agent (barium oxide, for example) inside the sealing material.

Further, after the airtight properties have been increased by the packaging process, a connector (flexible printed circuit: FPC) is attached in order to connect terminals led from the elements or circuits formed on the substrate with external signal terminals. Then, a finished product is completed. This state at which the product is ready for shipment is referred to as a display device throughout this specification.

Furthermore, in accordance with the process shown in Embodiment 3, the number of photo masks required for manufacture of a display device can be suppressed. As a result, the process can be shortened, and the reduction of the manufacturing cost and the improvement of the yield can be attained.

(Embodiment 4)

Figure 11A:
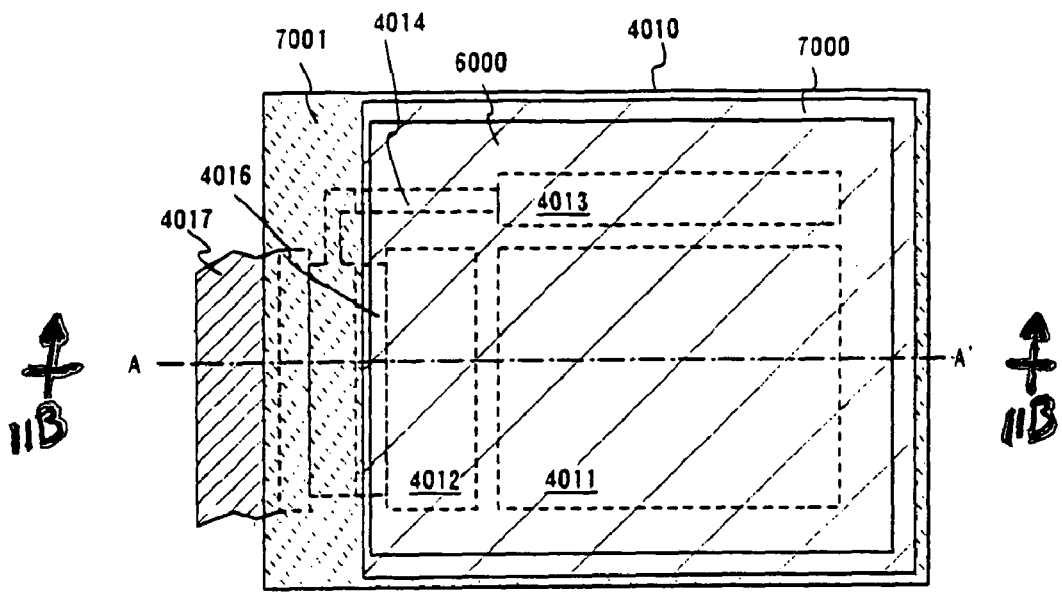
FIGS. 11A and 11B are a top plan view and a cross-sectional view of an EL display device.

FIG. 11A is a top surface diagram of an EL display device using the driving method of the present invention. In FIG. 11A, reference numeral 4010 denotes a substrate, while reference numeral 4011 denotes a pixel portion, 4012 denotes a source signal line driver circuit, and 4013 denotes a gate signal line driver circuit. The respective driver circuits are connected to an external equipment via wirings 4014 and 4016 leading to an FPC 4017.

A cover material 6000, an airtight sealing material (also referred to as a housing material) 7000, and a sealing material (a second sealing material) 7001 are provided at this time so as to surround at least the pixel portion, and preferably the driver circuit and the pixel portion.

Figure 11B:
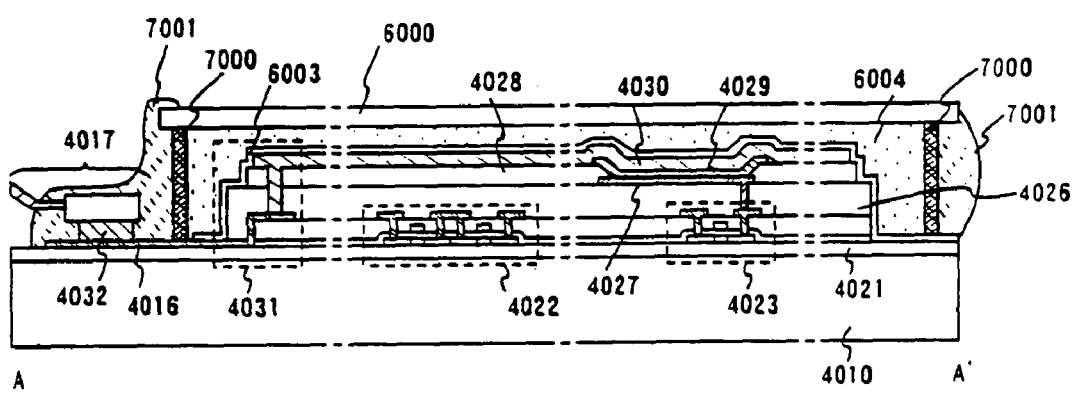

Further, FIG. 11B is a cross sectional structure of the EL display device of Embodiment 4, and a driver circuit TFT (note that a CMOS circuit in which an n-channel TFT and a p-channel TFT are combined is shown in the figures here) 4022 and a pixel portion TFT 4023 (note that only an EL driving TFT is shown in the figures here) are formed on a base film 4010 on the substrate 4021. Known structures (top gate structures or bottom gate structures) may be used for these TFTs.

After completing the driver circuit TFT 4022 and the pixel portion TFT 4023 by using a known method of manufacturing, a pixel electrode 4027 made from a transparent conducting film for electrically connecting to a drain of the pixel portion TFT 4023 is formed on an interlayer insulating film (leveling film) 4026 made from a resin material. A compound of indium oxide and tin oxide (referred to as ITO) and a compound of indium oxide and zinc oxide can be used as the transparent conducting film. An insulating film 4028 is formed once the pixel electrode 4027 is formed, and an open portion is formed on the pixel electrode 4027.

An EL layer 4029 is formed next. A lamination structure of a known EL material (hole injecting layer, hole transporting layer, light emitting layer, electron transporting layer, and electron injecting layer), or a single layer structure, may be used for the EL layer 4029. Further, there are low molecular weight materials and high molecular weight materials (polymer materials) for the EL material. An evaporation method is used when a low molecular weight material is used, but it is possible to use a simple method such as printing or spin coating of ink-jet printing when a high molecular weight material is used.

The EL layer is formed by evaporation using a shadow mask in Embodiment 4. Color display becomes possible by forming light emitting layers (a red color light emitting layer, a green color light emitting layer, and a blue color light emitting layer) capable of emitting light at different wavelength for each pixel using the shadow mask. In addition, a method of combining a color changing layer (CCM) and a color filter, and a method of combining a white color light emitting layer and a color filter are available, and both may be used. Of course, a single color light emitting electronic device can also be made.

After forming the EL layer 4029, a cathode 4030 is formed on the EL layer. It is preferable to remove as much moisture and oxygen as possible from the interface between the cathode 4030 and the EL layer 4029. A method in which the EL layer 4029 and the cathode 4030 are formed in succession within a vacuum, or in which the EL layer 4029 is formed in an inert environment and the cathode 4030 is then formed without exposure to the atmosphere is therefore necessary. The above film formation can be performed by using a multi-chamber method (cluster tool method) film formation apparatus.

Note that a lamination structure of a LiF (lithium fluoride) film and an Al (aluminum) film is used as the cathode 4030 in Embodiment 4. Specifically, a 1 nm thick LiF (lithium fluoride) film is formed by evaporation on the EL layer 4029, and a 300 nm thick aluminum film is formed on the LiF film. An MgAg electrode, which is a known cathode material, may of course also be used. The cathode 4030 is then connected to the wiring 4016 in a region denoted by reference numeral 4031. The wiring 4016 is an electric power source supply line for applying a predetermined voltage to the cathode 4030, and is connected to the FPC 4017 through a conducting paste material 4032.

The cathode 4030 and the wiring 4016 are electrically connected in the region shown by reference numeral 4031, and therefore it is necessary to form contact holes in the interlayer insulating film 4026 and in the insulating film 4028. These contact holes may be formed during etching of the interlayer insulating film 4026 (when the pixel electrode contact hole is formed) and during etching of the insulating film 4028 (when forming the open portion before forming the EL layer). Further, etching may also be performed together through to the interlayer insulating film 4026 when etching the insulating film 4028. A contact hole having a good shape can be formed in this case provided that the interlayer insulating film 4026 and the insulating film 4028 are formed by the same resin material.

A passivation film 6003, a filler material 6004 and the cover material 6000 are formed covering the surface of the EL element thus formed.

In addition, the sealing material 7000 is formed on the inside of the cover material 6000 and the substrate 4010 so as to surround the EL element portion. The airtight sealing material (the second sealing material) 7001 is formed on the outside of the sealing material 7000.

The filler material 6004 functions as an adhesive for bonding the cover material 6000. PVC (polyvinyl chloride), epoxy resin, silicone resin, PVB (polyvinyl butyral) and EVA (ethylene vinyl acetate) can be used as the filler material 6004. A moisture absorption effect can be maintained if a drying agent is formed on the inside of the filler material 6004, and therefore it is preferable to do so.

Furthermore, spacers may be included within the filler material 6004. The spacers may be made from a powdered substance composed of a material such as BaO, giving the spacers themselves moisture absorbency.

The passivation film 6003 can relieve the spacer pressure for cases of forming the spacers. Further, a film such as a resin film, separate from the passivation film 6003, may also be formed for relieving the spacer pressure.

Further, a glass plate, an aluminum plate, a stainless steel plate, an FRP (fiberglass-reinforced plastic) plate, a PVF (polyvinyl fluoride) film, a mylar film, a polyester film, and an acrylic film can be used as the cover material 6000. Note that when using PVB or EVA as the filler material 6004, it is preferable to use a sheet having a structure in which several 10 of μm of aluminum foil is sandwiched by a PVF film or a mylar film.

Note that, depending upon the direction of light emitted from the EL elements (light emission direction), it may be necessary for the cover material 6000 to have light transmitting characteristics.

Further, the wiring 4016 is electrically connected to the FPC 4017 through a gap between the sealing material 7000 and the airtight sealing material 7001, and the substrate 4010. Note that, although the wiring 4016 is explained here, the other wiring 4014 are also electrically connected to the FPC 4017 by passing under the sealing material 7000 and the airtight sealing material 7001.

Note that the cover material 6000 is bonded after forming the filler material 6004 in FIG. 11, and that the sealing material 7000 is attached so as to the side surface (exposed surface) of the filler material 6004, but the filler material 6004 may also be formed after attaching the cover material 6000 and the sealing material 7000. A filler material injection port passing through the gap formed by the substrate 4010, the cover material 6000 and the sealing material 7000 is formed in this case. The gap is then placed in a vacuum state (equal to or less than $10^{-2}$ torr), and after immersing the injection port in a tank containing the filler material, the pressure on the outside of the gap is made higher than the pressure within the gap, and the filler material fills the space.

(Embodiment 5)

Figure 12A:
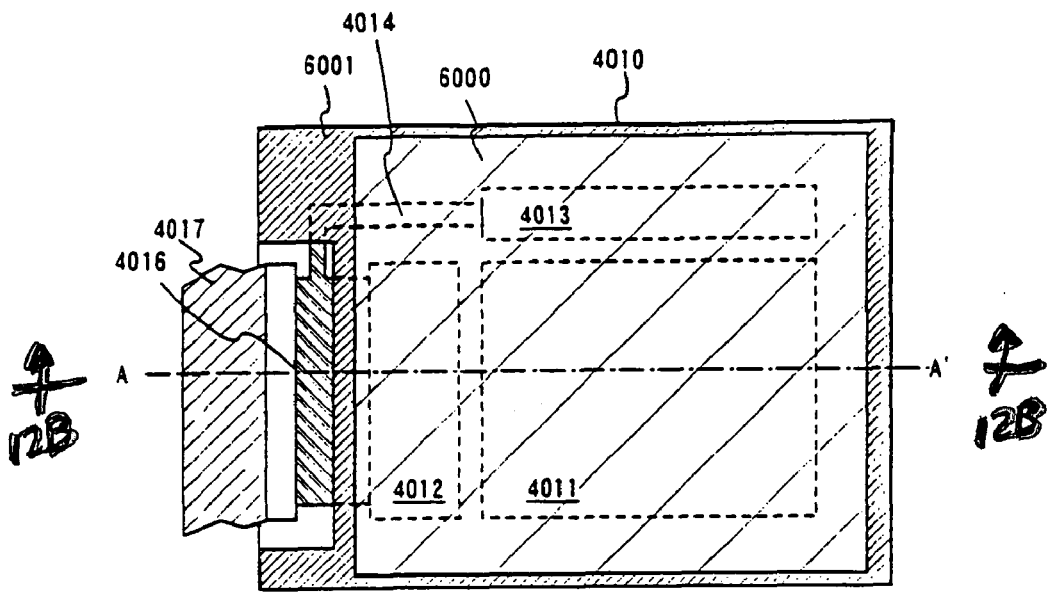
FIGS. 12A and 12B are a top plan view and a cross-sectional view of an EL display device.
Figure 12B:
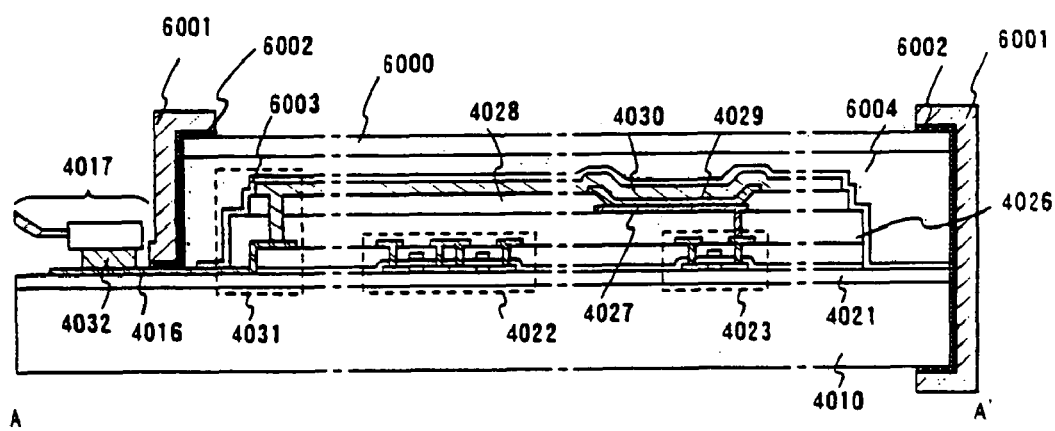

Next, an example of manufacturing the EL display device which have a different form from that shown in FIGS. 11A and 11B is explained using FIGS. 12A and 12B. The explanation of the same number as FIGS. 11A and 11B are omitted because they are indicated same portion.

FIG. 12A is a top view of an EL display device using the present invention. FIG. 12B shows a cross sectional view which is cut along the line A–A' in FIG. 12A.

A passivation film 6003 is formed covering the surface of the EL element thus made according to FIG. 11.

The filler material 6004 is provided and further functions as an adhesive for bonding the cover member 6000. PVC (polyvinyl chloride), epoxy resin, silicone resin, PVB (polyvinyl butyral), and EVA (ethylene vinyl acetate) can be used as the filler material 6004. If a drying agent is formed on the inside of the filler material 6004, then it can continue to maintain a moisture absorbing effect, which is preferable.

Further, spacers may be contained within the filler material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film to relieve the spacer pressure.

Furthermore, a glass plate, an aluminum plate, a stainless steel plate, an FRP (fiberglass-reinforced plastics) plate, a PVF (polyvinyl fluoride) film, a Mylar film, a polyester film, and an acrylic film can be used as the cover material 6000. Note that if PVB or EVA is used as the filler material 6004, it is preferable to use a sheet with a structure in which several tens of μm of aluminum foil is sandwiched by a PVF film or a Mylar film.

However, depending upon the light emission direction from the EL element (the light radiation direction), it is necessary for the cover material 6000 to have light transmitting characteristics.

Next, the cover material 6000 is bonded by using the filler material 6004. Thereafter, a frame member 6001 is attached so as to cover side surfaces (exposed surfaces) formed by the filler material 6004. The frame member 6001 is bonded by a sealing material 6002 (functioning as an adhesive). Preferably, a photo-setting resin is used as sealing material 6002. However, a thermosetting resin may be used if the heat resistance of the EL layer is high enough to allow use of such a resin. It is desirable that the sealing material 6002 has such properties as to inhibit permeation of moisture and oxygen as effectively as possible. A desiccant may be mixed in the sealing material 6002.

Further, the wiring 4016 is electrically connected to the FPC 4017 through a gap between the sealing material 6002 and the substrate 4010. Note that although an explanation of the wiring 4016 has been made here, the wiring 4014 is also electrically connected to the FPC 4017 by similarly passing underneath the sealing material 6002.

In FIG. 12, the cover material 6000 is bonded after forming the filler material 6004, and the frame material 6001 is attached so as to cover the lateral surfaces (exposed surfaces) of the filler material 6004, but the filler material 6004 may also be formed after attaching the cover material 6000 and the frame material 6001. In this case, an injection opening of the filler material is formed through a gap formed by the substrate 4010, the cover material 6000, and the frame material 6001. The gap is set into a vacuum state (a pressure equal to or less than $10^{-2}$ Torr), and after immersing the injection opening in the tank holding the filler material, the air pressure outside of the gap is made higher than the air pressure within the gap, and the filler material fills the gap.

(Embodiment 6)

Figure 13:
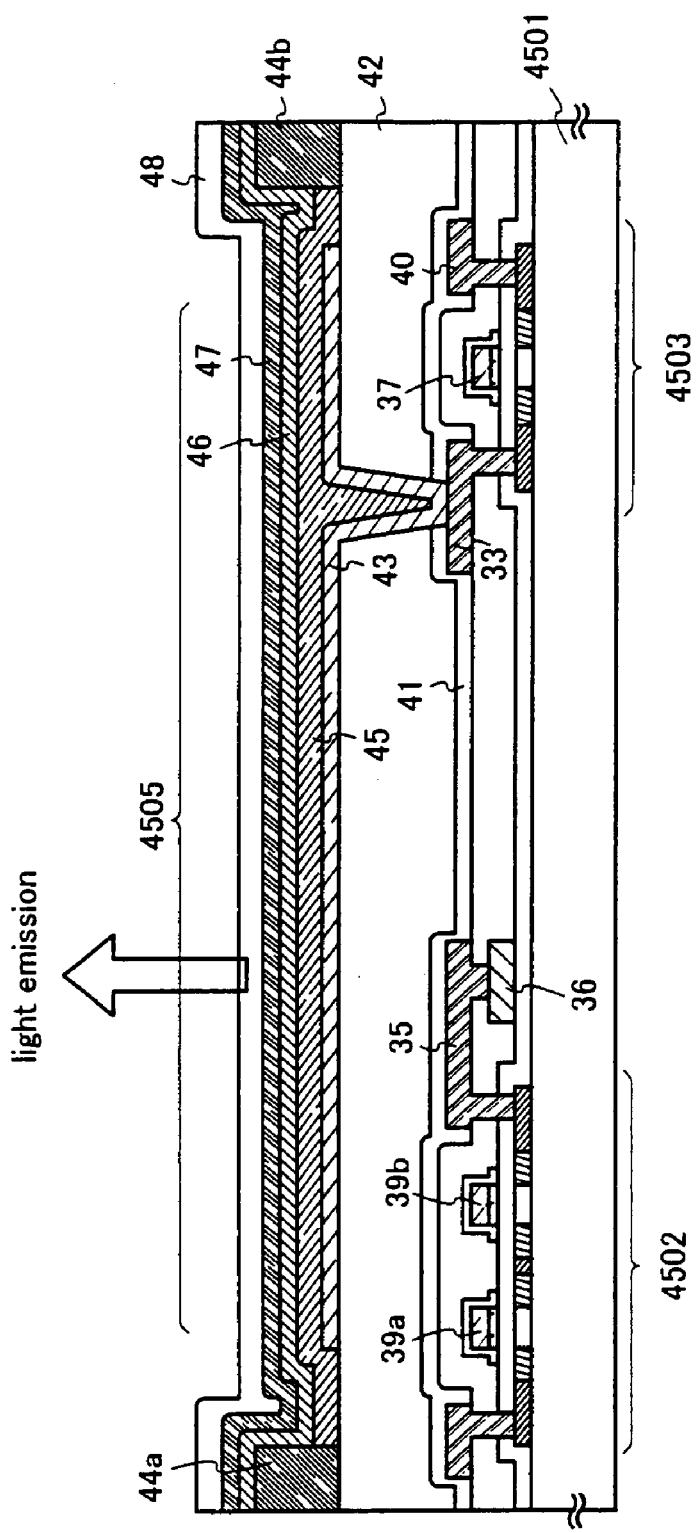
FIG. 13 is a cross-sectional view of a pixel portion of an EL display device.

Here, FIG. 13 illustrates a further detailed structure in cross section of a pixel portion of an EL display device. In FIG. 13, a switching TFT 4502 provided on a substrate 4501 is an n-channel type TFT formed by a known method. In the present embodiment, the switching TFT 4502 is of a double gate structure with gate electrodes 39a and 39b. By adopting the double gate structure, two TFTs are substantially connected in series, and thus, there is an advantage that an off current value can be decreased. It is to be noted that, though the double gate structure is adopted in the present embodiment, a single gate structure, a triple gate structure, or a multiple gate structure having more than three gates may also be adopted. Further, a p-channel type TFT formed by a known method may also be used.

In the present embodiment, an EL driving TFT 4503 is an n-channel type TFT formed by a known method. A gate electrode 37 of the EL driving TFT 4503 is electrically connected to a drain wiring 35 of the switching TFT 4502 via a wiring 36.

Since the EL driving TFT is an element for controlling the amount of electric current through the EL element, a lot of electric current passes through it, and thus, it is highly liable to deterioration due to heat or due to hot carrier. Therefore, a structure, in which an LDD region is provided at the side of a drain of the EL driving TFT so as to overlap the gate electrode through a gate insulating film, is quite effective.

Further, a single gate structure with one gate electrode 37 of the EL driving TFT 4503 is shown in the figures in this embodiment, but a multi-gate structure in which a plurality of TFTs are connected in series may also be used. In addition, a structure in which a plurality of TFTs are connected in parallel, with partition into a plurality of channel forming regions, and which can perform radiation of heat with high efficiency, may also be used.

Though the top gate TFT is used in this embodiment, the bottom gate TFT can also be used.

Further, a source wiring 40 is connected to a power supply line (not illustrated), and constant voltage is always applied to the source wiring 40.

A first passivation film 41 is formed on the switching TFT 4502 and the EL driving TFT 4503, and a leveling film 42 comprising an insulating resin film is formed on the first passivation film 41. It is extremely important to level the step due to the TFTs using the leveling film 42. An EL layer formed later is extremely thin, and there are cases in which defective light emissions occur. Therefore, to form the EL layer with its surface which is as level as possible, it is preferable to perform leveling before forming a pixel electrode.

Furthermore, reference numeral 43 denotes a pixel electrode (a cathode of an EL element in this case) made from a conductive film with high reflectivity, and is electrically connected to a drain region of the EL driving TFT 4503. It is preferable to use a low resistance conductive film, such as an aluminum alloy film, a copper alloy film, and a silver alloy film, or a laminate of such films. Of course, a lamination structure with another conductive film may also be used.

In addition, a light emitting layer 45 is formed in a groove (corresponding to a pixel) formed by banks 44a and 44b formed of insulating films (preferably resins). Note that only one pixel is shown in the figure here, but the light emitting layer may correspond to each of the colors R (red), G (green), and B (blue). A π conjugate polymer material is used as an organic EL material. Polyparaphenylene vinylenes (PPVs), polyvinyl carbazoles (PVKs), and polyfluoranes can be given as typical polymer materials.

Note that there are several types of PPV organic EL materials, and materials recorded in Shenk, H., Becker, H., Gelsen, O., Kluge, E., Kreuder, W., and Spreitzer, H., "Polymers for Light Emitting Diodes", Euro Display Proceedings, 1999, pp. 33–7, and in Japanese Patent Application Laid-open No. Hei 10-92567, for example, may be used.

As specific light emitting layers, cyano-polyphenylene vinylene may be used as a red light emitting layer, polyphenylene vinylene may be used as a green light emitting layer, and polyphenylene vinylene or polyalkylphenylene may be used as a blue light emitting layer. The film thickness may be between 30 and 150 nm (preferably between 40 and 100 nm).

However, the above example is merely one example of the organic EL materials which can be used as light emitting layers, and it is not necessary to limit use to these materials. An EL layer may be formed by freely combining light emitting layers, electron transport layers, and electron injection layers.

For example, the present embodiment shows an example of using a polymer material as a light emitting layer, but a low molecular weight organic EL material may also be used. Further, it is possible to use inorganic materials such as silicon carbide, as an electron transport layer or an electron injection layer. Known materials can be used for these organic EL materials and inorganic materials.

An EL layer with a laminate structure, in which a hole injection layer 46 made of PEDOT (polythiophene) or PAni (polyaniline) is formed on the light emitting layer 45, is used in the present embodiment. An anode 47 is then formed on the hole injection layer 46 of a transparent conductive film. The light generated in the light emitting layer 45 is radiated toward the upper surface (the opposite direction to the substrate 4501 where TFT is formed) in the present embodiment, and therefore the anode must have a conductive property and be formed of a material with a property of being transparent to light. A compound of indium oxide and tin oxide, or a compound of indium oxide and zinc oxide can be used as the transparent conductive film. However, because it is formed after forming the low heat resistance light emitting and hole injection layers, it is preferable to use a material which can be deposited at as low a temperature as possible.

An EL element 4505 is complete at the point where the anode 47 is formed. Note that what is called the EL element 4505 here is formed by the pixel electrode (anode) 43, the light emitting layer 45, the hole injection layer 46, and the anode 47. The pixel electrode 43 is nearly equal in area to the pixel, and consequently the entire pixel functions as an EL element. Therefore, the light emitting efficiency is extremely high, and a bright image display becomes possible.

In addition, a second passivation film 48 is then formed on the anode 47 in the present embodiment. It is preferable to use a silicon nitride film or an oxidized silicon nitride film as the second passivation film 48. The purpose of this is the isolation of the EL element from the outside, and this is meaningful in preventing degradation due to oxidation of the organic EL material, and in controlling gaseous emitted from the organic EL material. The reliability of the EL display can thus be raised.

The EL display device of the present invention has a pixel portion made from pixels structured as in FIG. 13, and has a switching TFT with a sufficiently low off current value, and a current control TFT which is strong with respect to hot carrier injection. An EL device with high reliability, and in which good image display is possible, can therefore be obtained.

(Embodiment 7)

In this embodiment, there will be described a structure in which the structure of the EL element 4505 is reversed in the pixel portion illustrated in Embodiment 6. Explanation will be given with reference to FIG. 14. Note that, since the points of difference from the structure shown in FIG. 13 lie only in the EL element and the driver TFT, the other explanation shall be omitted from description.

Figure 14:
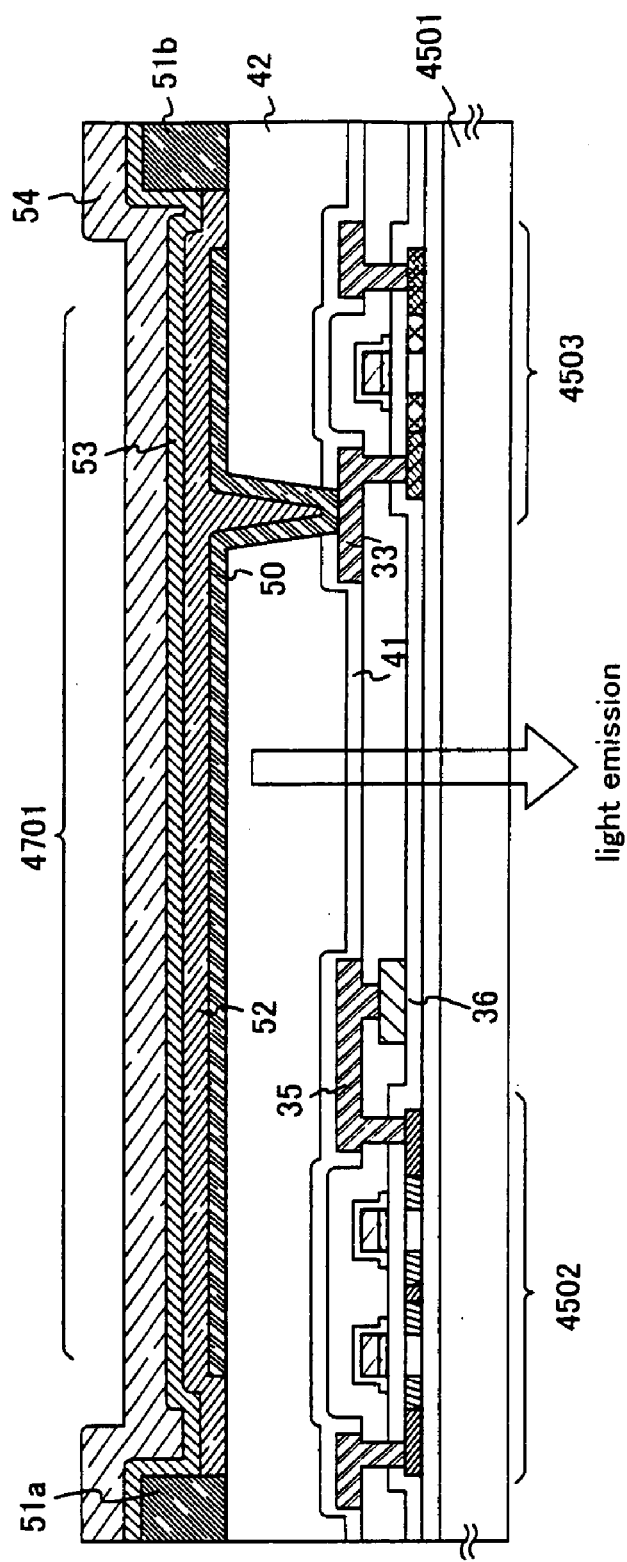
FIG. 14 is a cross-sectional view of a pixel portion of an EL display device.

Referring to FIG. 14, an EL driving TFT 4503 is formed using the p-channel TFT manufactured by known method.

In this embodiment, a transparent conductive film is employed as a pixel electrode (anode) 50. Concretely, the conductive film is made of a compound of indium oxide and zinc oxide. Of course, a conductive film made of a compound of indium oxide and tin oxide may well be employed.

Besides, after banks 51a and 51 of an insulating film have been formed, a light emitting layer 52 made of polyvinylcarbazole is formed on the basis of the application of a solution. An electron injection layer 53 made of potassium acetylacetonate (expressed as acacK), and a cathode 54 made of an aluminum alloy are formed thereon. In this case, the cathode 54 functions also as a passivation film. Thus, an EL element 4701 is formed.

In the case of this embodiment, light generated in the light emitting layer 52 is radiated toward a substrate 4501 formed with TFTs as indicated by an arrow.

(Embodiment 8)

The following description of Embodiment 8 is the construction of the source signal line driver circuit.

Figure 6:
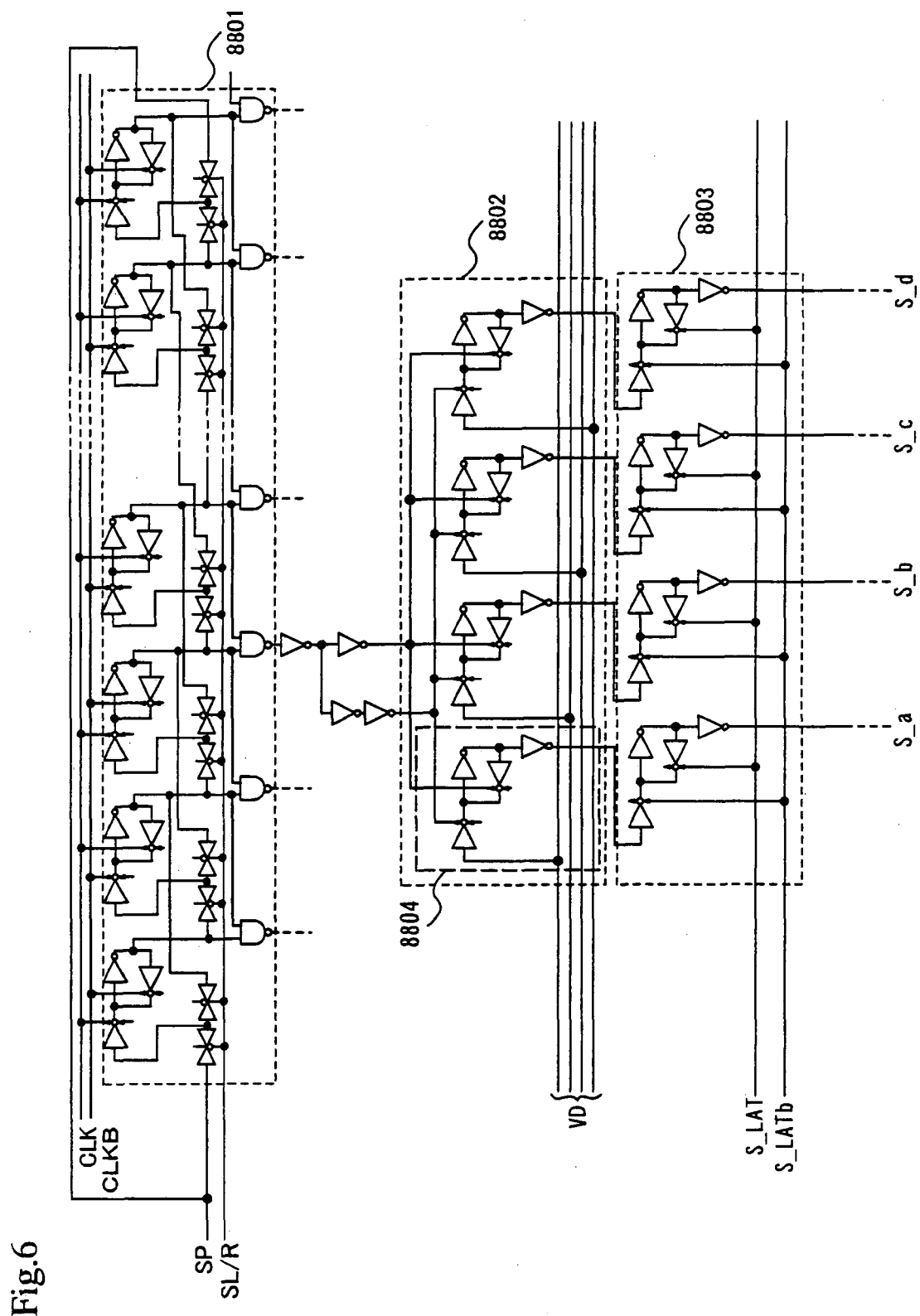
FIG. 6 is a circuit diagram showing a source signal line driver circuit of the EL display device.

FIG. 6 is a circuit diagram showing the source signal line driver circuit. A shift register 8801, a latch (A) 8802 and a latch (B) 8803 are disposed as shown in FIG. 6. In Embodiment 8, the latch (A) 8802 and the latch (B) 8803 are disposed to correspond to four source signal lines S_a to S_d. Embodiment 8 is not provided with a level shifter for varying the amplitude width of the voltage of a signal, the level shift may be disposed as required.

A clock signal CLK, a clock signal CLKB which has an opposite polarity to the clock signal CLK, a start pulse signal SP and a driving-direction switching signal SL/R are inputted to the shifter register 8801 via the respective lines shown in FIG. 6. A digital signal VD which is inputted from the outside is divided into four signals, and the four signals are inputted to the latch (A) 8802 via the respective lines shown in FIG. 6. A latch signal S_LAT and a signal S_LATb which has an opposite polarity to the latch signal S_LAT are inputted to the latch (B) 8803 via the respective lines shown in FIG. 6.

When the signal output from the shifter register 8801 is inputted to the latch (A) 8802, the latch (A) 8802 obtains four signals at the same time from the four divided digital signals VD. In response to the latch signals S_LAT and S_LATb the latch (B) 8803 latches the digital signals VD and output them to the source signal lines S_a to S_d.

In the above description of Embodiment 8, the method of simultaneously sampling signals corresponding to four source signal lines with the use of four divided video signals. However, in general, n-number of divided digital signals may be used to simultaneously sample signals corresponding to n-number of source signal lines.

The detailed construction of the latch (A) 8802 will be described below with illustrative reference to a part 8804 of the latch (A) 8802 which corresponds to the source signal line S_a. The part 8804 of the latch (A) 8802 has two clocked inverters and two inverters.

Figure 7:
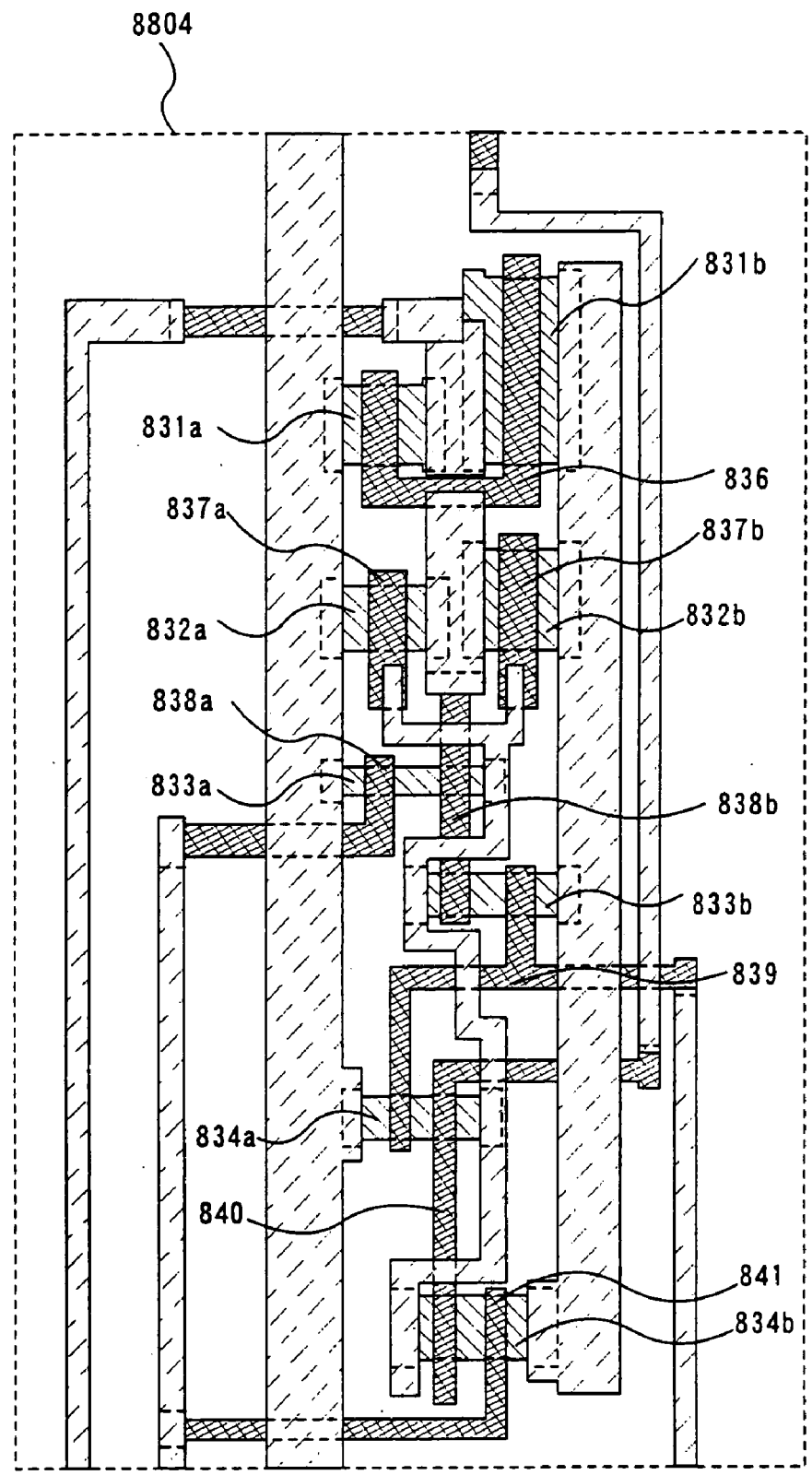
FIG. 7 is a top plan view of a latch of the EL display device.

FIG. 7 is a top plan view showing a part 8804 of the latch (A) 8802. Reference numerals 831a and 831b denote active layers of TFTs which form one of the inverters of the part 8804 of the latch (A) 8802, and reference numeral 836 denotes a gate electrode which is common to the TFTs which form the one of the inverters. Reference numerals 832a and 832b denote active layers of TFTs which form the other of the inverters of the part 8804 of the latch (A) 8802, and reference numerals 837a and 837b denote gate electrodes which are provided over the active layers 832a and 832b, respectively. Incidentally, the gate electrodes 837a and 837b are electrically connected to each other.

Reference numerals 833a and 833b denote active layers of TFTs which form one of the clocked inverters of the part 8804 of the latch (A) 8802. Gate electrodes 838a and 838b are provided over the active layer 833a so as to constitute a double-gate structure. The gate electrode 838b and a gate electrode 839 are provided over the active layer 833b so as to constitute a double-gate structure.

Reference numerals 834a and 834b denote active layers of TFTs which form the other of the clocked inverters of the part 8804 of the latch (A) 8802. The gate electrode 839 and a gate electrode 840 are provided over the active layer 834a so as to constitute a double-gate structure. The gate electrode 840 and a gate electrode 841 are provided over the active layer 834b so as to constitute a double-gate structure.

(Embodiment 9)

Figure 15A:
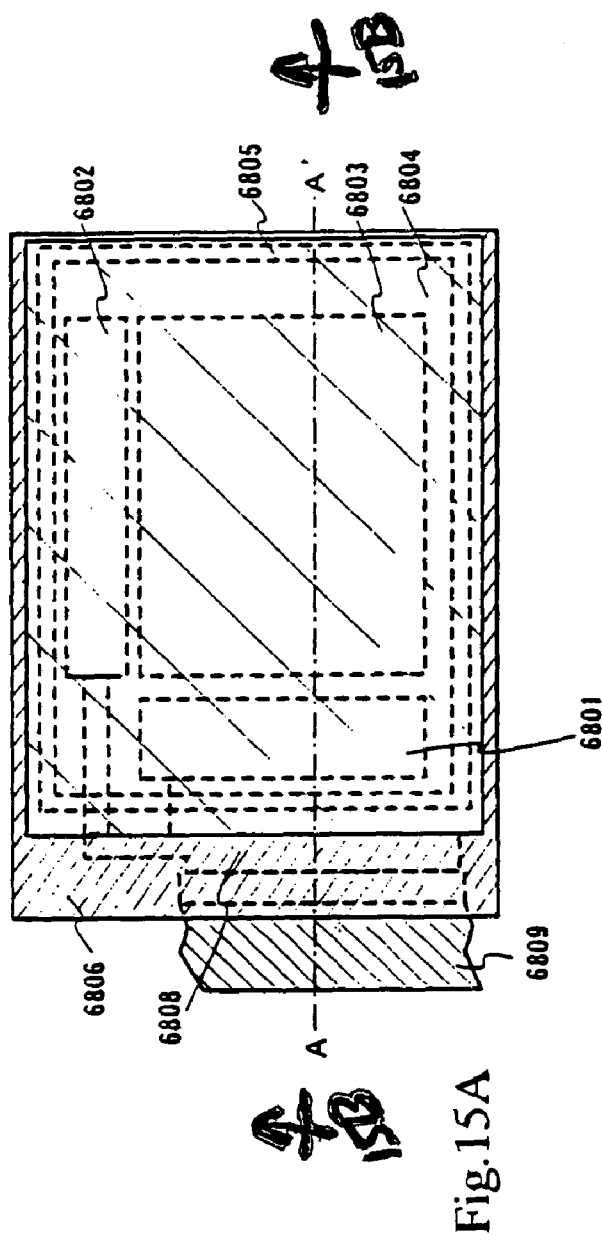
FIGS. 15A and 15B are a top plan view and a cross-sectional view of an EL display device.

Embodiment 9 will be described below with reference to FIGS. 15A and 15B which show a fabricated example of an EL display device using the driving method according to the invention. FIG. 15A is a top plan view showing the state in which EL elements formed on an active matrix substrate are sealed. Sections 6801, 6802 and 6803, each of which is shown by dashed lines, are a source signal line driver circuit, a gate signal line driver circuit and a pixel portion, respectively. Sections 6804, 6805 and 6806 are a cover material, a first sealing material and a second sealing material, respectively. A filler 6807 (refer to FIG. 15B) is provided in the inside portion surrounded by the first sealing material 6805 between the cover material 6804 and the active matrix substrate.

Reference numeral 6808 denotes connecting lines to transmit input signals to the source signal line driver circuit 6801, the gate signal line driver circuit 6802 and the pixel portion 6803, and the connecting lines 6808 receive video signals and clock signals from an FPC (flexible printed circuit) 6809 which serves as a connecting terminal to external equipment.

Figure 15B:
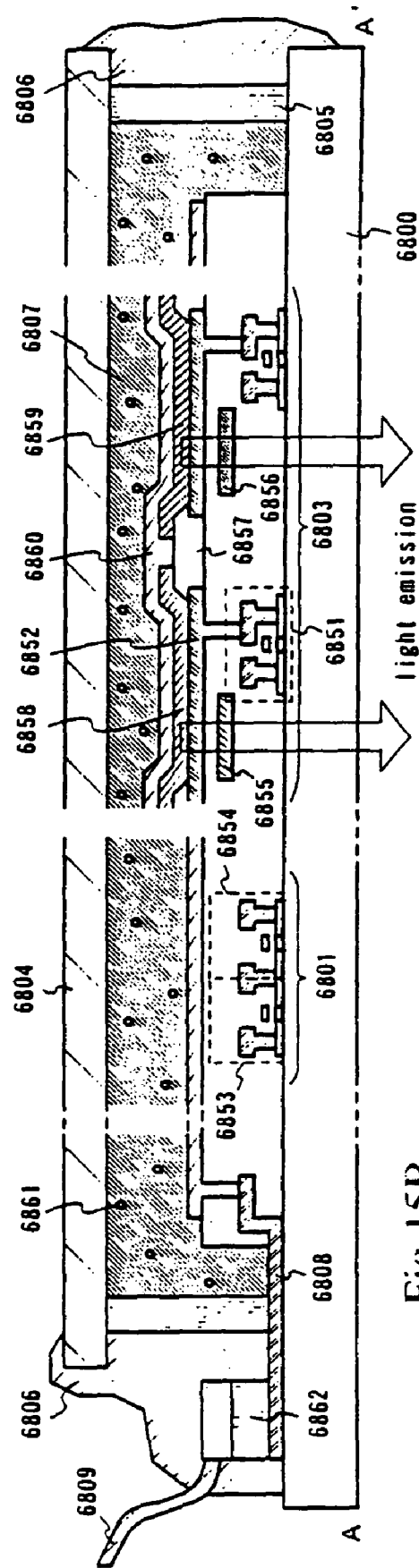

FIG. 15B is a cross-sectional view taken along line A–A' of FIG. 15A. In FIGS. 15A and 15B, the same reference numerals are used to denote the same portions.

As shown in FIG. 15B, the pixel portion 6803 and the source signal line driver circuit 6801 are formed on a substrate 6800, and the pixel portion 6803 is made of plural pixels each including a TFT 6851 for controlling current to flow through an EL element (hereinafter referred to as the EL driving TFT 6851), a pixel electrode 6852 electrically connected to a drain region of the EL driving TFT 6851 and the like. In Embodiment 9, the EL driving TFT 6851 is a p-channel type TFT. The source signal line driver circuit 6801 is formed of a CMOS circuit in which an N-channel type TFT 6853 and a P-channel type TFT 6854 are complementarily combined with each other.

Each pixel has a color filter (R) 6855, a color filter (G) 6856 or a color filter (B) (not shown) under its pixel electrode. The color filter (R) is a color filter which extracts red light, the color filter (G) is a color filter which extracts green light, and the color filter (B) is a color filter which extracts blue light. The color filter (R) 6855 is provided in a pixel which emits red, the color filter (G) 6856 is provided in a pixel which emits green, and the color filter (B) is provided in a pixel which emits blue.

The first advantage of the case where these color filters are provided is that the color purity of each emitted color is improved. For example, red light is emitted from the EL element of each pixel which emits red (toward the pixel electrode in the present embodiment), and the purity of red can be improved by passing the red light through the color filter which extracts red light. The other green light and blue light are also subjected to similar processing.

In a conventional structure which does not use color filters, there may occur the problem that visible light which enters from the outside of an EL display device excites the emitting layers of its EL elements and no desired colors can be obtained. However, if color filters are disposed as in the case of Embodiment 9, light with particular wavelength is only allowed to enter the EL elements. That is to say, it is possible to prevent the problem that the EL elements are excited by external light.

Incidentally, although structures provided with color filters have heretofore been proposed, white-emitting EL elements have been used in such structures. In this case, light with the other wavelengths is cut off to extract red light, so that a lowering of luminance is incurred. However, in Embodiment 9, since red light emitted from the EL elements is passed through color filters which extract red light, a lowering of luminance is prevented from being incurred.

The pixel electrode 6852 is formed of a transparent conductive film, and functions as the anode of the EL element. Insulating films 6857 are formed at both ends of the pixel electrode 6852, and in addition, an emitting layer 6858 which emits red light and an emitting layer 6859 which emits green light are formed. Incidentally, although not shown, an emitting layer which emits blue light is provided in an adjacent pixel, whereby color display is provided by the pixels which individually correspond to red, green and blue. Of course, the pixels comprising blue-emitting layers are provided with color filters which extract blue light.

Not only an organic material but also an inorganic material may be used as an EL material. In addition, a stacked structure, in which an electron injection layer, an electron transport layer, a hole transport layer and a hole injection layer are combined, may be adopted.

A cathode 6860 of the EL element is formed of a conductive film with light-shielding characteristics, on each of the emitting layers. This cathode 6860 is common to all the pixels, and is electrically connected to the FPC 6809 via connecting lines 6808.

Then, the first sealing material 6805 is formed with a dispenser or the like, and spacers (not shown) are scattered and the cover material 6804 is stuck. Then, the area which is surrounded by the active matrix substrate 6800, the cover material 6804 and the first sealing material 6805 is filled with the filler 6807 by a vacuum injection method.

In addition, in Embodiment 9, barium oxide is previously added to the filler 6807 as a hygroscopic material 6861. Incidentally, in Embodiment 9, the filler 6807 is a filler containing a hygroscopic material, but the hygroscopic material may also be sealed in the filler in the state of being dispersed in massive form. Although not shown, a hygroscopic material may also be used as the material of spacers.

Then, after the filler 6807 has been cured by irradiation of ultraviolet rays or by heating, an opening (not shown) formed in the first sealing material 6805 is closed. After the openings of the first sealing material 6805 have been closed, the connecting lines 6808 and the FPC 6809 are electrically connected to each other by the use of a conductive material 6862. In addition, a second sealing material 6806 is formed to cover the exposed portion of the first sealing material 6805 and a part of the FPC 6809. The second sealing material 6806 may use the same material as the first sealing material 6805.

By sealing the EL elements with filler 6807 with the use of the above-described method, it is possible to completely isolate the EL elements from the outside, whereby a substance which promotes oxidation of an organic material, such as water or oxygen, can be prevented from penetrating from the outside. Accordingly, it is possible to fabricate a highly reliable EL display device.

(Embodiment 10)

Figure 16:
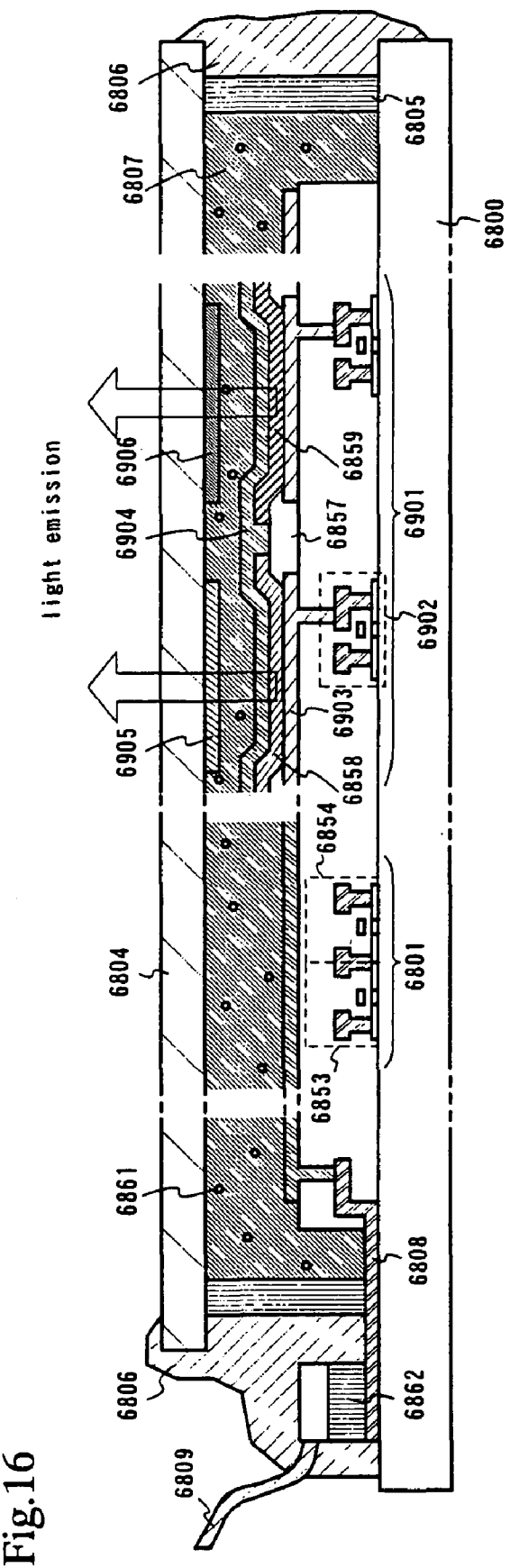
FIG. 16 is a cross-sectional view of an EL display device.
Figure 17:
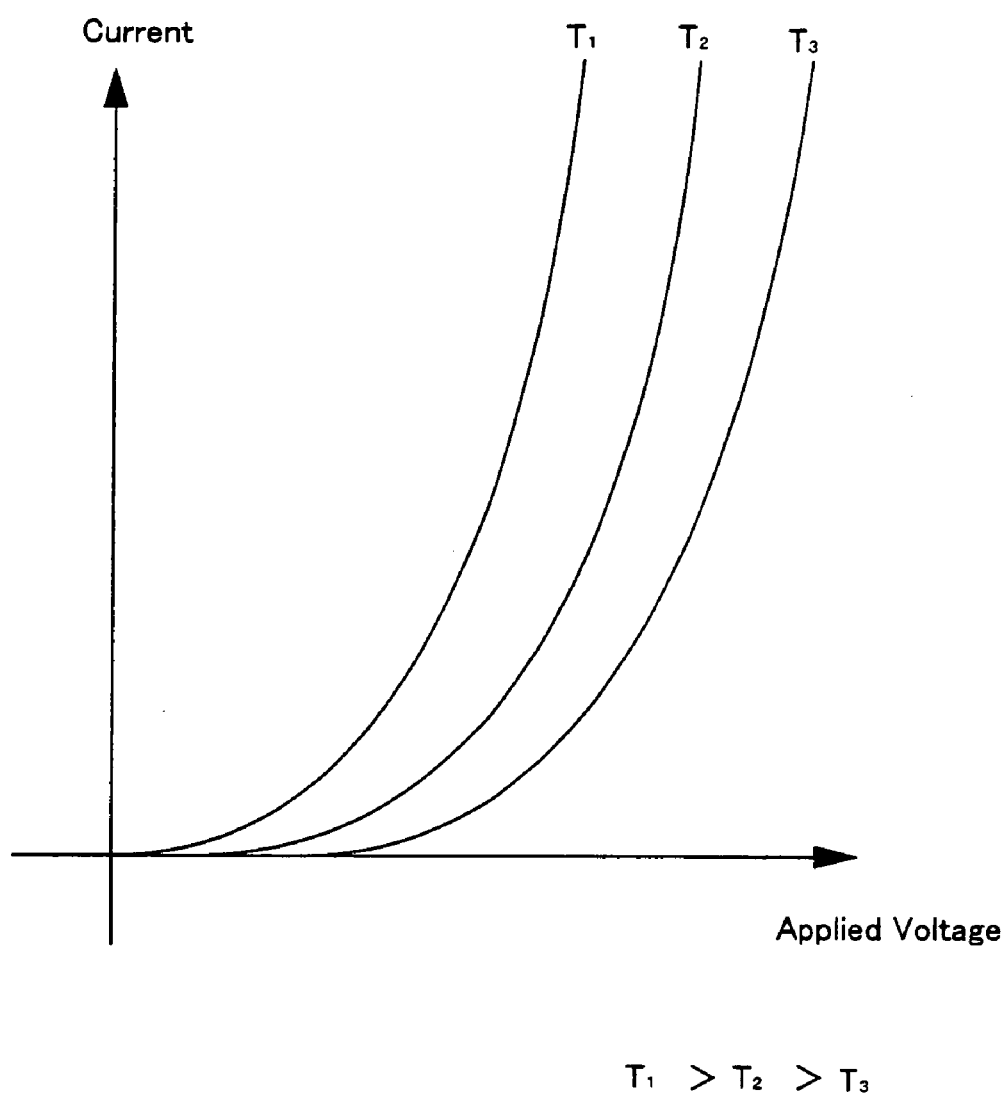
FIG. 17 is a graph showing the temperature characteristic of an EL element.

In the description of Embodiment 10, an example will be described, in which the direction of irradiation of light emitted from EL elements and the arrangement of color filters differ in the EL display device according to Embodiment 9. The following description uses FIG. 16, but the pixel portion shown in FIG. 16 is the same in basic structure as that shown in FIG. 15B, and the modified portions of the construction shown in FIG. 16 are denoted by different reference numerals.

As shown in FIG. 15B, a pixel portion 6901 is formed of plural pixels each including a TFT 6902 for controlling current to flow through the EL element (hereinafter referred to as the EL driving TFT 6902), a pixel electrode 6903 electrically connected to a drain region of the TFT 6902 and the like.

In Embodiment 10, an n-channel type TFT is used as the EL driving TFT 6902 in the pixel portion 6901. The pixel electrode 6903 is electrically connected to the drain of the EL driving TFT 6902, and is formed of a conductive film with light-shielding characteristics. In Embodiment 10, the pixel electrode 6903 serves as a cathode of the EL element.

A transparent conductive film 6904 which is common to all the pixels is formed on the light emitting layer 6858 which emits red light and the light emitting layer 6859 which emits green light. The transparent conductive film 6904 serves as an anode of the EL element.

In addition, Embodiment 10 has the feature that a color filter (R) 6905, a color filter (G) 6906 and a color filter (B) (not shown) are formed on the cover material 6804. In the case of the structure of the EL element according to Embodiment 10, the direction of irradiation of light emitted from the EL layer is toward the cover material 6804, whereby the color filters can be disposed in the path of light in the structure shown in FIG. 16.

In the case of forming the color filter (R) 6905, the color filter (G) 6906 and the color filter (B) (not shown) on the cover material 6804, there is the advantage that it is possible to reduce the number of the steps required to fabricate the active matrix substrate and it is possible to realize an improvement in yield factor and throughput.

(Embodiment 11)

In the EL display device using the driving method according to the present invention, the material for the EL layers of EL elements is not limited to organic EL materials, and may also use inorganic EL materials. However, since the current inorganic EL materials need very high driving voltages, it is necessary to use TFTs which have breakdown voltage characteristics against such driving voltages.

In addition, if inorganic EL materials with lower driving voltage are developed in the future, such inorganic EL materials can be applied to the present invention.

(Embodiment 12)

In the EL display device using the driving method according to the present invention, organic materials to be used for the EL layer may be low molecular weight organic materials or polymeric (high molecular weight) organic materials. Materials such as Alq$_3$ (tris-8-quinolinolato-aluminum) and TPD (triphenylamine derivative) are known as the low molecular weight organic materials. As the polymeric organic materials, π-conjugated polymeric materials are used. Representative examples are PPV (polyphenylene vinylene), PVK (poly(vinylcarbazole) and polycarbonate.

The polymeric (high molecular weight) organic materials can be formed by a simple thin-film deposition method such as a spin-coating method (also called a solution-applying method), a dipping method, a dispensing method, a printing method, or an ink-jet method, and have higher heat resistance then molecular weight organic materials.

In the EL element of an EL display device, if the EL layer of the EL element has an electron transport layer and a hole transport layer, the electron transport layer and the hole transport layer may be formed of an amorphous semiconductor of an inorganic material such as amorphous Si or amorphous $Si_{1-x}C_x$.

In the amorphous semiconductor, a large number of trap levels are present, and a large number of interfacial levels are formed at the interface where the amorphous semiconductor is in contact with another layer. Accordingly, the EL elements can emit light at low voltage, and a far higher luminance can be realized.

Dopants (impurities) may also be added to an organic EL layer to change the color of light to be emitted from the organic EL layer. The dopants are DCM 1, nile red, rubrene coumarin 6, TPB, quinacridone and the like.

(Embodiment 13)

This embodiment will be described on electronic devices incorporated an EL display device using the driving method of the invention.

As these electronic devices, there can be enumerated a video camera, a digital camera, a head-mountable display (a goggle type display), a game machine, a car navigation, a personal computer, and a mobile information terminal (e.g., a mobile computer, a mobile telephone or an electronic book), as shown in FIGS. 18A to 18E.

FIG. 18A shows a personal computer including a body 2001, a casing 2002, a display portion 2003 and a keyboard 2004. The EL display device using a driving method of the present invention can be used as the display portion 2003 of the personal computer.

FIG. 18B shows a video camera including a body 2101, a display portion 2102, a voice input unit 2103, manipulation switches 2104, a battery 2105 and an image receiving unit 2106. The EL display device using a driving method of the present invention can be used as the display portion 2102 of the video camera.

FIG. 18C shows one portion (i.e., a right-hand side) of a head-mounted display including a body 2301, a signal cable 2302, a head fixing band 2303, a display unit 2304, an optical system 2305 and a display portion 2306. The EL display device using a driving method of the present invention can be used the display portion 2306 of the head-mounted display.

FIG. 18D shows an image reproducing device (e.g., a DVD reproducing device) provided with a recording medium. The image reproducing device includes a body 2401, a recording medium (CD, LD or DVD and the like) 2402, manipulation switches 2403 and display units (a) 2404 and (b) 2405. The display portion 2404 (a) displays a image information and the display portion (b) 2405 displays character information. The EL display device using a driving method of the present invention can be used the display portion (a) 2404 and (b) 2405. Here, this device is enabled to CD reproduction device and the game device as the recording medium.

FIG. 18E shows a mobile computer including a body 2501, a camera portion 2502, a image receiving unit 2503, an operation switch 2504 and a display portion 2505. The EL display device using a driving method of the present invention can be used as the display portion 2505 of the mobile computer.

As has been described hereinbefore, the invention can have an extremely wide range of applications and can be applied to electronic devices of any fields. On the other hand, the electronic device of this embodiment can be realized by using a construction of any of the combinations of Embodiments 1 to 12.

In the related art gray scale display method for active matrix type EL display devices, there has been the problem that the amount of current which flows in the EL elements of an EL display device becomes non-uniform due to the unevenness of the characteristics of the TFTs of the pixel portion of the EL display device or due to variations in the environmental temperature during the use of the EL display device, so that unevenness occurs in the luminance display of the EL display device.

However, owing to the above-described construction, the invention makes it possible to keep a current which flows in each of the EL elements of the pixel portion, constant with respect to variations in temperature, thereby suppressing the unevenness of display. Accordingly, it is possible to provide a driving method for an EL display device capable of high-quality display.

What is claimed is:

1. A method of driving a display device which comprises a pixel comprising an EL element and a thin film transistor, comprising the step of:
    dividing one frame period into plural sub-frame periods, and
    applying one of a first gate voltage and a second gate voltage to a gate electrode of the thin film transistor during each of the plural sub-frame periods,
    wherein a drain current of the thin film transistor flows between both electrodes of the EL element to place the EL element into an emitting state when the first gate voltage is applied to the gate electrode of the thin film transistor,
    wherein the thin film transistor is placed into a non-conductive state and the EL element is placed into a non-emitting state when the second gate voltage is applied to the gate electrode of the thin film transistor, and
    wherein the thin film transistor is operated in a saturation region in order to keep said drain current constant with respect to temperature variations.

2. A method of driving a display device according to claim 1, wherein the EL element enables color display by using an EL layer which emits light of one color in combination with a color conversion layer.

3. A method of driving a display device according to claim 1, wherein the EL element enables color display by using an EL layer which emits white light, in combination with a color filter.

4. A method of driving a display device according to claim 1, wherein an EL layer of the EL element comprises one of a low molecular weight organic material and a polymeric organic material.

5. A method of driving a display device according to claim 4, wherein the low molecular weight organic material is one of Alq$_3$ (tris-8-quinolinolato-aluminum) and TPD (triphenylamine derivative).

6. A method of driving a display device according to claim 4, wherein the polymeric organic material is one of PPV (polyphenylene vinylene), PVK (poly(vinylcarbazole), and polycarbonate.

7. A method of driving a display device according to claim 1, wherein the EL layer of the EL element comprises an inorganic material.

8. A method of driving a display device according to claim 1, wherein one of a source and a drain of the thin film transistor is electrically connected to a power source line and the other of the source and the drain of the thin film transistor is electrically connected to the EL element.

9. A method of driving a display device according to claim 1, wherein the pixel further comprises a second thin film transistor, one of a source and a drain of the second thin film transistor is electrically connected to the gate electrode of the thin film transistor, the other of the source and the drain of the second thin film transistor is electrically connected to a source signal line, and a gate of the second thin film transistor is electrically connected to a gate signal line.

10. A method of driving a display device which comprises a pixel comprising an EL element, a thin film transistor and a resistor, comprising the step of:
    dividing one frame period into plural sub-frame periods, and
    applying one of a first gate voltage and a second gate voltage to a gate electrode of the thin film transistor during each of the plural sub-frame periods,
    wherein a drain current of the thin film transistor flows across the resistor and both electrodes of the EL element and the EL element is placed into an emitting state when the first gate voltage is applied to the thin film transistor,
    wherein the thin film transistor is placed into a non-conductive state and the EL element is placed into a non-emitting state when the second gate voltage is applied to the gate electrode of the thin film transistor, and
    wherein the thin film transistor is operated in a saturation region in order to keep said drain current constant with respect to temperature variations.

11. A method of driving a display device according to claim 10, wherein the EL element enables color display by using an EL layer which emits light of one color in combination with a color conversion layer.

12. A method of driving a display device according to claim 10, wherein the EL element enables color display by using an EL layer which emits white light, in combination with a color filter.

13. A method of driving a display device according to claim 10, wherein an EL layer of the EL element comprises one of a low molecular weight organic material and a polymeric organic material.

14. A method of driving a display device according to claim 13, wherein the low molecular weight organic material is one of Alq$_3$ (tris-8-quinolinolato-aluminum) and TPD (triphenylamine derivative).

15. A method of driving a display device according to claim 13, wherein the polymeric organic material is one of PPV (polyphenylene vinylene), PVK (poly(vinylcarbazole), and polycarbonate.

16. A method of driving a display device according to claim 10, wherein the EL layer of the EL element comprises an inorganic material.

17. A method of driving a display device according to claim 10, wherein one of a source and a drain of the thin film transistor is electrically connected to a power source line though the resistor and the other of the source and the drain of the thin film transistor is electrically connected to the EL element.

18. A method of driving a display device according to claim 10, wherein the pixel further comprises a second thin film transistor, one of a source and a drain of the second thin film transistor is electrically connected to the gate electrode of the thin film transistor, the other of the source and the drain of the second thin film transistor is electrically connected to a source signal line, and a gate of the second thin film transistor is electrically connected to a gate signal line.

19. A method of driving a display device which comprises a pixel comprising an EL element and a thin film transistor by a time gray scale method, comprising the step of:
  applying one of a first gate voltage and a second gate voltage to a gate electrode of the thin film transistor,
  wherein the EL element is placed into an emitting state when the first gate voltage is applied to the gate electrode of the thin film transistor,
  wherein the EL element is placed into a non-emitting state when the second gate voltage is applied to the gate electrode of the thin film transistor, and
  wherein the thin film transistor is operated in a saturation region when the first voltage is applied to the gate electrode of the thin film transistor to place the EL element in the emitting state.

20. A method of driving a display device according to claim 19, wherein the EL element enables color display by using an EL layer which emits light of one color in combination with a color conversion layer.

21. A method of driving a display device according to claim 19, wherein the EL element enables color display by using an EL layer which emits white light, in combination with a color filter.

22. A method of driving a display device according to claim 19, wherein an EL layer of the EL element comprises one of a low molecular weight organic material and a polymeric organic material.

23. A method of driving a display device according to claim 22, wherein the low molecular weight organic material is one of Alq$_3$ (tris-8-quinolinolato-aluminum) and TPD (triphenylamine derivative).

24. A method of driving a display device according to claim 22, wherein the polymeric organic material is one of PPV (polyphenylene vinylene), PVK (poly(vinylcarbazole), and polycarbonate.

25. A method of driving a display device according to claim 19, wherein the EL layer of the EL element comprises an inorganic material.

26. A method of driving a display device according to claim 19, wherein one of a source and a drain of the thin film transistor is electrically connected to a power source line and the other of the source and the drain of the thin film transistor is electrically connected to the EL element.

27. A method of driving a display device according to claim 19, wherein the pixel further comprises a second thin film transistor, one of a source and a drain of the second thin film transistor is electrically connected to the gate electrode of the thin film transistor, the other of the source and the drain of the second thin film transistor is electrically connected to a source signal line, and a gate of the second thin film transistor is electrically connected to a gate signal line.

28. A method of driving a display device which comprises a pixel comprising an EL element, a thin film transistor and a resistor by a time gray scale method, comprising the step of:
  applying one of a first gate voltage and a second gate voltage to a gate electrode of the thin film transistor,
  wherein the EL element is placed into an emitting state when the first gate voltage is applied to the thin film transistor,
  wherein the EL element is placed into a non-emitting state when the second gate voltage is applied to the gate electrode of the thin film transistor, and
  wherein the thin film transistor is operated in a saturation region when the first voltage is applied to the gate electrode of the thin film transistor to place the EL element in the emitting state.

29. A method of driving a display device according to claim 28, wherein the EL element enables color display by using an EL layer which emits light of one color in combination with a color conversion layer.

30. A method of driving a display device according to claim 28, wherein the EL element enables color display by using an EL layer which emits white light, in combination with a color filter.

31. A method of driving a display device according to claim 28, wherein an EL layer of the EL element comprises one of a low molecular weight organic material and a polymeric organic material.

32. A method of driving a display device according to claim 31, wherein the low molecular weight organic material is one of Alq$_3$ (tris-8-quinolinolato-aluminum) and TPD (triphenylamine derivative).

33. A method of driving a display device according to claim 31, wherein the polymeric organic material is one of PPV (polyphenylene vinylene), PVK (poly(vinylcarbazole), and polycarbonate.

34. A method of driving a display device according to claim 28, wherein the EL layer of the EL element comprises an inorganic material.

35. A method of driving a display device according to claim 28, wherein one of a source and a drain of the thin film transistor is electrically connected to a power source line though the resistor and the other of the source and the drain of the thin film transistor is electrically connected to the EL element.

36. A method of driving a display device according to claim 28, wherein the pixel further comprises a second thin film transistor, one of a source and a drain of the second thin film transistor is electrically connected to the gate electrode of the thin film transistor, the other of the source and the drain of the second thin film transistor is electrically connected to a source signal line, and a gate of the second thin film transistor is electrically connected to a gate signal line.

* * * * *